(12) United States Patent
Ota

(10) Patent No.: US 9,780,738 B2
(45) Date of Patent: Oct. 3, 2017

(54) SEMICONDUCTOR DEVICE

(75) Inventor: Kazuki Ota, Kawasaki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 103 days.

(21) Appl. No.: 14/239,810

(22) PCT Filed: Aug. 21, 2012

(86) PCT No.: PCT/JP2012/071058
§ 371 (c)(1),
(2), (4) Date: Feb. 20, 2014

(87) PCT Pub. No.: WO2013/027722
PCT Pub. Date: Feb. 28, 2013

(65) Prior Publication Data
US 2014/0203877 A1 Jul. 24, 2014

(30) Foreign Application Priority Data
Aug. 22, 2011 (JP) .................................. 2011-180163

(51) Int. Cl.
*H03F 3/16* (2006.01)
*H01L 29/40* (2006.01)
(Continued)

(52) U.S. Cl.
CPC ............. *H03F 3/16* (2013.01); *H01L 29/402* (2013.01); *H01L 29/7786* (2013.01); *H01L 29/2003* (2013.01)

(58) Field of Classification Search
CPC  H01L 29/402; H01L 29/2003; H01L 29/7786
See application file for complete search history.

(56) References Cited

U.S. PATENT DOCUMENTS 7,075,125 B2    7/2006  Saito et al.
7,826,100 B2   11/2010  Henry et al.
(Continued)

FOREIGN PATENT DOCUMENTS

JP    2005-093864 A    4/2005
JP    2006-147663 A    6/2006
(Continued)

OTHER PUBLICATIONS

International Search Report of PCT/JP2012/071058 dated Nov. 13, 2012.

(Continued)

*Primary Examiner* — Cheung Lee
*Assistant Examiner* — Stephen C Smith
(74) *Attorney, Agent, or Firm* — Sughrue Mion, PLLC

(57) ABSTRACT

A semiconductor device is provided with: a field-effect transistor that has a source electrode and a drain electrode that are connected to a semiconductor layer, a gate electrode that is provided on the surface of the semiconductor layer between the source electrode and the drain electrode, and a field plate electrode that is provided on the surface of the semiconductor layer in the vicinity of the gate electrode via an insulating layer, wherein the field-effect transistor amplifies high frequency signals received by the gate electrode to be outputted from the drain electrode; and a voltage dividing circuit that divides a potential difference between the drain electrode and a reference potential GND, and applies a bias voltage such that respective parts of the field plate electrode have a mutually equal potential.

18 Claims, 15 Drawing Sheets

(51) Int. Cl.
*H01L 29/778* (2006.01)
*H01L 29/20* (2006.01)

(56) References Cited

U.S. PATENT DOCUMENTS

| | | | |
|---|---|---|---|
| 7,838,903 B2 | 11/2010 | Kikkawa et al. | |
| 7,863,648 B2 | 1/2011 | Miyamoto et al. | |
| 8,076,749 B2 | 12/2011 | Kitagawa et al. | |
| 2005/0062069 A1 | 3/2005 | Saito et al. | |
| 2007/0046379 A1 | 3/2007 | Tanahashi et al. | |
| 2007/0228422 A1 | 10/2007 | Suzuki et al. | |
| 2008/0048785 A1* | 2/2008 | Mokhtar | H03F 1/26 330/311 |
| 2008/0315343 A1 | 12/2008 | Kitagawa et al. | |
| 2009/0230429 A1 | 9/2009 | Miyamoto et al. | |
| 2009/0230430 A1* | 9/2009 | Miyamoto | H01L 29/404 257/192 |
| 2009/0256210 A1 | 10/2009 | Matsushita et al. | |
| 2010/0051962 A1 | 3/2010 | Kikkawa et al. | |
| 2010/0118455 A1* | 5/2010 | Kusunoki | H01L 21/823878 361/56 |
| 2010/0314710 A1* | 12/2010 | Yamaji | H01L 24/05 257/501 |
| 2011/0309372 A1* | 12/2011 | Xin | H01L 27/0605 257/76 |
| 2012/0043638 A1 | 2/2012 | Kitagawa et al. | |
| 2012/0313709 A1* | 12/2012 | Lautzenhiser | H03F 1/301 330/285 |
| 2014/0111268 A1* | 4/2014 | Imada | H03K 17/063 327/383 |
| 2014/0268447 A1* | 9/2014 | Gudem | H01L 27/0255 361/56 |

FOREIGN PATENT DOCUMENTS

| | | |
|---|---|---|
| JP | 2006-351753 A | 12/2006 |
| JP | 2007-042813 A | 2/2007 |
| JP | 2007-060458 A | 3/2007 |
| JP | 2007-273795 A | 10/2007 |
| JP | 2008-227474 A | 9/2008 |
| JP | 2010-199241 A | 9/2010 |
| JP | 2012-195348 A | 10/2012 |
| WO | 2006/132418 A1 | 12/2006 |
| WO | 2008/069074 A1 | 6/2008 |

OTHER PUBLICATIONS

Communication dated Jan. 12, 2016, from the State Intellectual Property Office of People's Republic of China in counterpart Application No. 201280041237.3.

* cited by examiner

11: SEMICONDUCTOR SUBSTRATE
12: SOURCE ELECTRODE
13: DRAIN ELECTRODE
14: INSULATING FILM
15: GATE ELECTRODE
16: GATE TERMINAL
17: FIELD PLATE ELECTRODE
18: MIM CAPACITOR BUILT UP IN 2 LAYERS
19: GROUNDING ELECTRODE
20: INDUCTOR
21: RESISTOR (INTERPOSING RESISTOR 21, CONNECTED TO OUTGOING LINE 191)

F-F CROSS SECTION

SEMICONDUCTOR DEVICE

CROSS-REFERENCE TO RELATED APPLICATIONS

This application is a National Stage of International Application No. PCT/JP2012/071058 filed Aug. 21, 2012, claiming priority based on Japanese patent application No. 2011-180163 filed on Aug. 22, 2011, the contents of all of which are incorporated herein by reference in their entirety.

TECHNICAL FIELD

The present invention relates to a semiconductor device provided with a field-effect transistor. In particular the invention relates to a semiconductor device provided with a field-effect transistor that amplifies high frequency power with regard to microwaves or the like, using a group-III nitride semiconductor.

BACKGROUND

As a semiconductor device that amplifies high frequency power with regard to microwaves or the like, research and development are being actively pursued regarding field-effect transistors (FET) that use a group-III nitride semiconductor such as GaN or the like. In a field-effect transistor (FET) using a group-III nitride semiconductor, at a time of large signal operation a state occurs in which negative charge accumulates on a surface due to surface trap response, and a phenomenon is known that is called "current collapse" where maximum drain current degrades, or a phenomenon is known in which, at a bias point immediately after an RF power operation is turned OFF, drain current decreases to about ¹/₁₀ of the value before the power operation and a long time of a minute or longer is required for recovery (referred to below as "drain current variation after turning RF OFF"); and suppression of this transient response phenomenon has become a problem in implementing a field-effect transistor using a group-III nitride semiconductor. It is to be noted that a description of "current collapse" is given in Patent Literature 1 and a description of "drain current variation after turning RF OFF" is given in Patent Literature 2.

As a means of suppressing this transient response phenomenon, Patent Literature 3 discloses a semiconductor device provided with a GaN field-effect transistor having field plate (FP) electrodes in a region between gate and drain. FIG. 10 is a cross-sectional view schematically showing a semiconductor device having conventional field plate electrodes, as described in Patent Literature 3. In this field-effect transistor, a semiconductor layer 2 is covered by an insulating film 16 between a gate electrode 13 and a drain electrode 15, and a first field plate electrode 17 and a second field plate electrode are provided on the insulating film 16. The first field plate electrode 17 is electrically shorted to the gate electrode 13 via external wiring L1, and the second field plate electrode 18 is electrically shorted to the source electrode 14 via external wiring L2.

A field plate electrode may be used in a MOSFET or the like to relax electrical field concentration in the vicinity of a gate or between drain and source, to improve transistor breakdown voltage. A semiconductor device having a field-effect transistor provided with a field plate electrode provided to relax this electrical field concentration and improve breakdown voltage is described in Patent Literature 4 and Patent Literature 5.

Patent Literature 4 discloses a structure in which voltage applied to a field plate electrode can be increased, not by electrically shorting the field plate electrode to the gate electrode or drain electrode, but by applying a potential other than these. A description is given of a configuration of a semiconductor device disclosed in Patent Literature 4, using FIG. 11 to FIG. 13. FIG. 11 is a plane view showing modelization of the semiconductor device in question; FIG. 12 A is a cross-sectional view along section A-A, which is a field-effect transistor portion of one side in FIG. 11; FIG. 12B is a cross-sectional view along section B-B, which is an MIM capacitor part of FIG. 11; and FIG. 13 is a circuit diagram shown described by the inventor in order to explain a circuit described in Patent Literature 4.

In this field-effect transistor, MIM capacitors 18a and 18b are respectively connected to field plate electrodes 17a or 17b by outgoing lines 171a and 171b, and electrodes 183a and 183b in an intermediate layer are connected to a grounding electrode 19 by outgoing lines 191a and 191b, interposing resistors 21a or 21b respectively. Electrodes 185a and 185b in an uppermost layer are each connected to a drain electrode 13 via an inductor 20. The inductor 20 has an inductance that compensates for delay time which occurs due to the MIM capacitor 18, when a voltage waveform of the drain electrode 13 is applied to a field plate electrode 17 via the MIM capacitor 18 that is built up in two layers. The field plate electrodes 17a and 17b are formed between the gate electrodes 15a and 15b and the drain electrode 13, at a prescribed distance from these gate electrodes.

According to Patent Literature 4, by having this configuration, at a time of RF power operation, a voltage inputted from the gate electrode 15 is amplified by the field-effect transistor, and after phase inversion, appears at the drain electrode 13. Furthermore, the voltage waveform that appears at the drain electrode 13 is again inverted at the MIM capacitors 18a and 18b and applied to the field plate electrodes 17a and 17b. That is, the voltage applied to the field plate electrodes 17a and 17b at a time of RF power operation has the same phase and same amplitude as the voltage of the drain electrode 13, is maximum at a point where signal amplitude on a load line has minimum current and maximum voltage, and is minimum at a point where current is maximum and voltage is minimum. For example, there is a description that, in a case of operating at $V_{d\_s\_b}$ (drain-source voltage at a bias point)=10V, voltage applied to the field plate electrode 17 has a maximum of 20V in an OFF state with minimum current and maximum voltage, and has a minimum of 0V in an ON state with maximum current and minimum voltage.

FIG. 14A shows a plane view and FIG. 14B shows a cross-sectional view F-F of a semiconductor device described in Patent Literature 5. In the conventional semiconductor device shown in FIGS. 14A and 14B, a MOSFET is provided in which are arranged a semiconductor layer 13 formed of N type silicon on a semiconductor substrate 11 with a first insulating layer 12 forming an SOI layer therebetween, with a field plate part 45b provided thereon. As shown in FIG. 14A, a drain region 42 connected to a drain electrode 49 is provided in the center of the MOSFET, and a source region 41 connected to a source electrode 48 is provided at an outermost periphery of the MOSFET. A gate electrode 45a is provided on a surface immediately inside the source region 41, with an insulating film therebetween. One end of the field plate part 45b is connected to the drain electrode 49, and the field plate part 45b goes around a drain region 42 in spiral form, with another end connected to the gate electrode 45a. The field plate part 45b is formed of material of relatively high resistance such as polycrystalline silicon, semi-insulating polycrystalline silicon or the like; the field plate part 45b itself forms a voltage dividing circuit, according to the resistance value of the field plate part 45b itself; and viewed from a direction in which a source region 41 and a drain region 42 are joined, the potential of the field plate part 45b is gradually distributed. There is a description in Patent Literature 5 that, according to the electrical field of the field plate part 45b, it is possible to gradually distribute the potential between a high potential side (a drain electrode 49 side) and a low potential side (a source electrode 48 side), and electrical field concentration can be suppressed in the semiconductor layer 13 and breakdown voltage can be improved. Patent Literature 5 also describes that the other end of the field plate part 45b may be connected to the source electrode 48 instead of the gate electrode 45a.

[PTL 1]
International Patent Publication No. 2006/132418
[PTL 2]
Japanese Patent Kokai Publication No. JP2006-147663A
[PTL 3]
Japanese Patent Kokai Publication No. JP2005-93864A
[PTL 4]
Japanese Patent Kokai Publication No. JP2007-042813A
[PTL 5]
Japanese Patent Kokai Publication No. JP2008-227474A

SUMMARY

The following analysis is given according to the present invention. A transient response phenomenon such as "current collapse" or "drain current variation after turning RF OFF", as described above, occurs due to capture/release of carriers at traps (surface traps) present in an interface between a semiconductor layer and an insulating film, in a region between a gate electrode and a drain electrode.

In a current collapse, a phenomenon may be understood in which, with a field-effect transistor repeatedly turned on/off at high frequencies with regard to microwave regions, since release of electrons from surface traps cannot follow operational frequency, the drain current decreases due to electrons staying captured in the surface traps.

In drain current variation after turning RF OFF, a phenomenon may be understood in which electrons are captured in surface traps by gate-drain reverse bias voltage during RF power operation, and immediately after the RF power operation is turned OFF, the drain current becomes very small, but thereafter, when RF is OFF and the transistor is held in an ON state with only a DC bias voltage applied, the drain current gradually recovers along with release of electrons from the surface traps.

By using a field plate electrode, it is possible to realize a function in which a surface depletion layer is reduced by the bias voltage and a drain current decrease is suppressed. In particular, it is effective to arrange the field plate electrode as close as possible to the gate electrode, and to apply as large a positive voltage as possible (in a case where carriers are electrons) to the field plate electrode in an ON state, in a range where an adequate breakdown voltage is obtained.

However, in a configuration where a field plate electrode as described in Patent Literature 3 is connected to a source electrode or a gate electrode, it is not possible to completely eliminate drain current decrease due to current collapse. Furthermore the suppression effect with regard to drain current variation after turning RF OFF is limited. In addition, in configurations of field plate electrodes provided in order to improve breakdown voltage as described in Patent Literature 4 and Patent Literature 5, it is not possible to suppress the abovementioned transient response phenomenon. More details are given concerning reasons for this in the description of the exemplary embodiments.

According to a first aspect of the present disclosure there is provided a semiconductor device comprising: a field-effect transistor that has a source electrode and a drain electrode that are connected to a semiconductor layer, a gate electrode that is provided on the surface of the semiconductor layer between the source electrode and the drain electrode, and a field plate electrode that is provided on the surface of the semiconductor layer in the vicinity of the gate electrode via an insulating layer, wherein the field-effect transistor amplifies high frequency signals received by the gate electrode to be outputted from the drain electrode; and a voltage dividing circuit that divides a potential difference between the drain electrode and a reference potential, and applies a bias voltage such that respective parts of the field plate electrode have a mutually equal potential.

According to the first aspect of the present disclosure, it is possible to apply to a field plate electrode a bias voltage so as to suppress channel narrowing by a voltage dividing circuit, and to suppress a transient response phenomenon such as current collapse or drain current variation after turning RF OFF.

PREFERRED MODES

Figure 1:
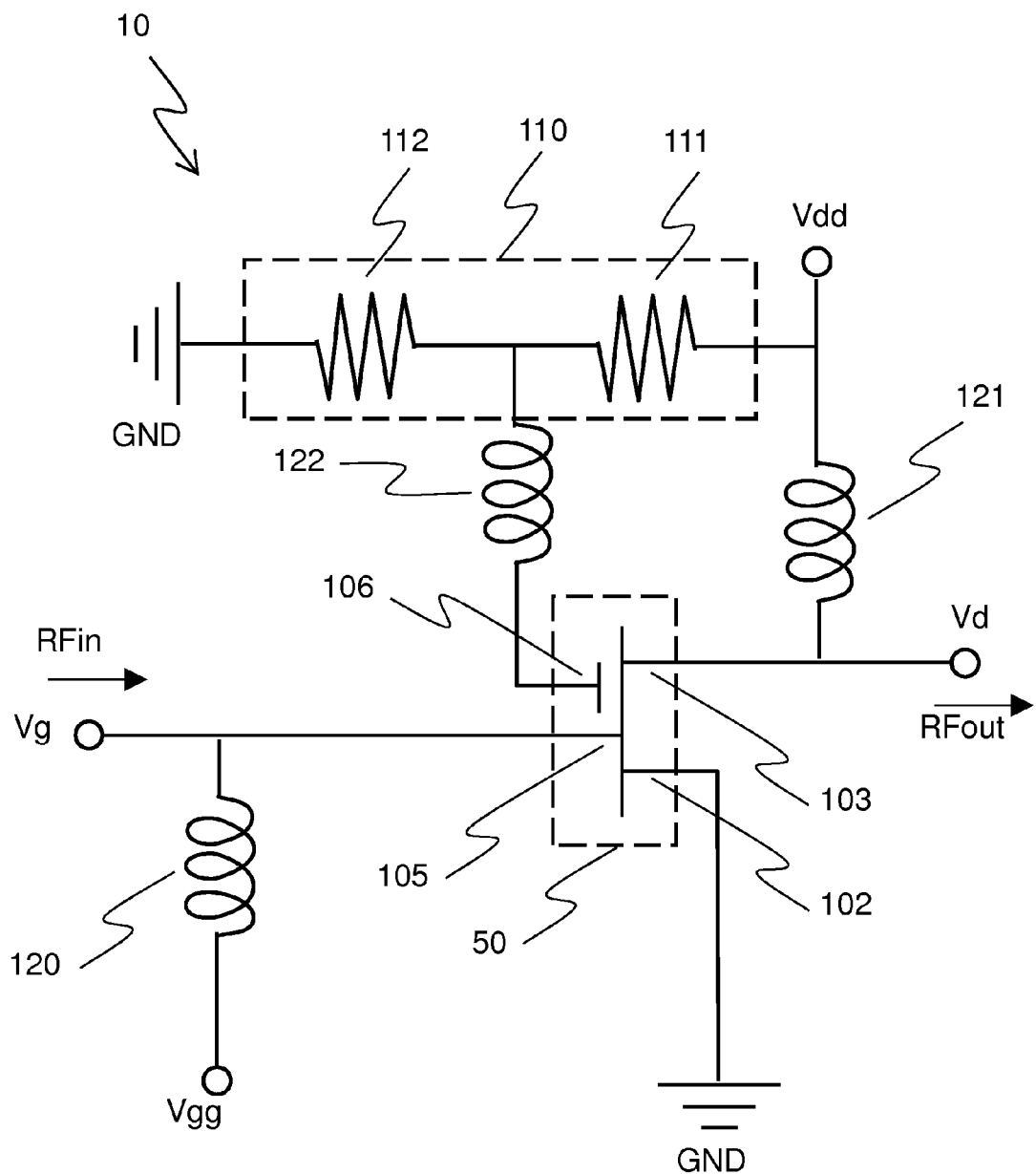
FIG. 1 is a circuit block diagram of a semiconductor device according to a first exemplary embodiment of the present disclosure.

A description is given of a summary of exemplary embodiments of the present disclosure. It is to be noted that that reference symbols in the attached drawings and the cited drawings in descriptions in this summary are examples solely in order to aid understanding, and are not intended to limit the disclosure to modes shown in the drawings.

Figure 2:
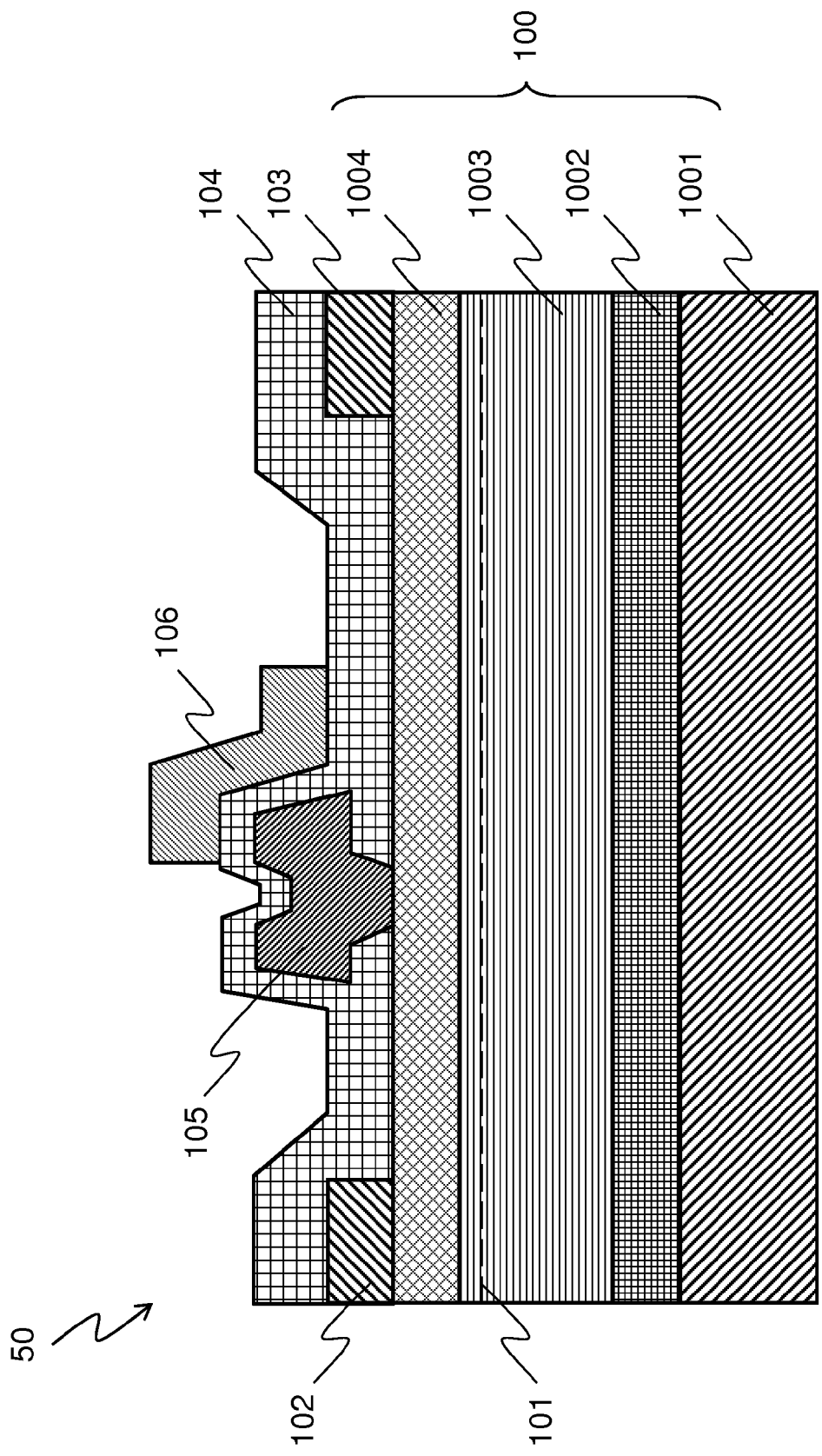
FIG. 2 is a cross-sectional diagram showing a structure of a field-effect transistor of FIG. 1.
Figure 9:
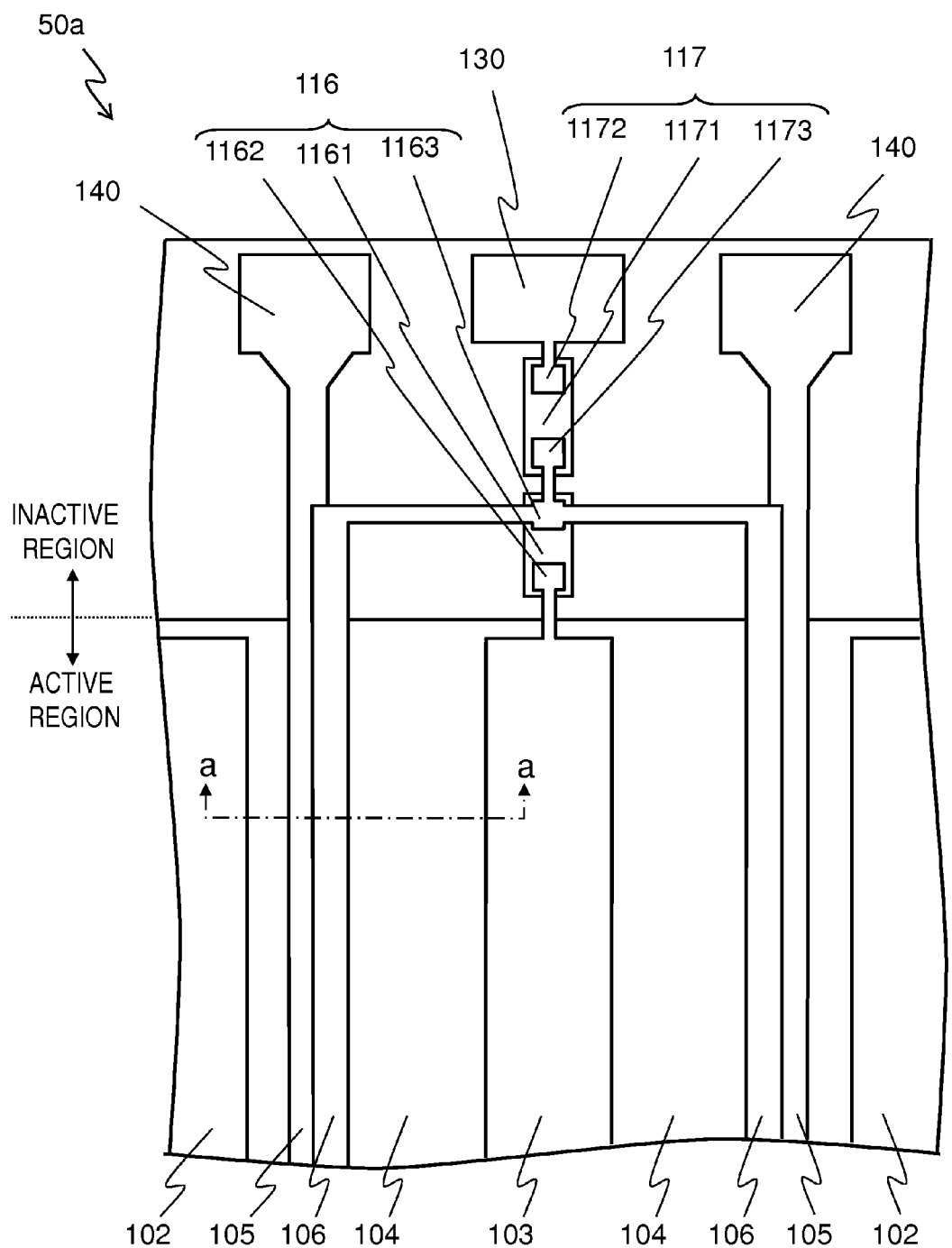
FIG. 9 is a planar view schematically showing a structure of a semiconductor chip 50a with respect to FIG. 8.

An example as shown in FIG. 1, FIG. 2 and FIG. 9, is provided with a field-effect transistor (50) that has a source electrode (102) and a drain electrode (103) connected to a semiconductor layer (100), a gate electrode (105) provided on the surface of the semiconductor layer between the source electrode and the drain electrode, and a field plate electrode (106) provided on the surface of the semiconductor layer in the vicinity of the gate electrode via an insulating layer (104), wherein the field-effect transistor amplifies high frequency signals (RFin) received by the gate electrode to be outputted from the drain electrode; and a voltage dividing circuit (110) that divides potential difference between the drain electrode and a reference potential (GND), and applies a bias voltage such that respective parts of the field plate electrode have the same potential as each other; wherein channel narrowing, caused by carriers being injected to the semiconductor layer surface in the vicinity of the gate electrode, is suppressed by means of a bias voltage applied to the field plate electrode.

Figure 5:
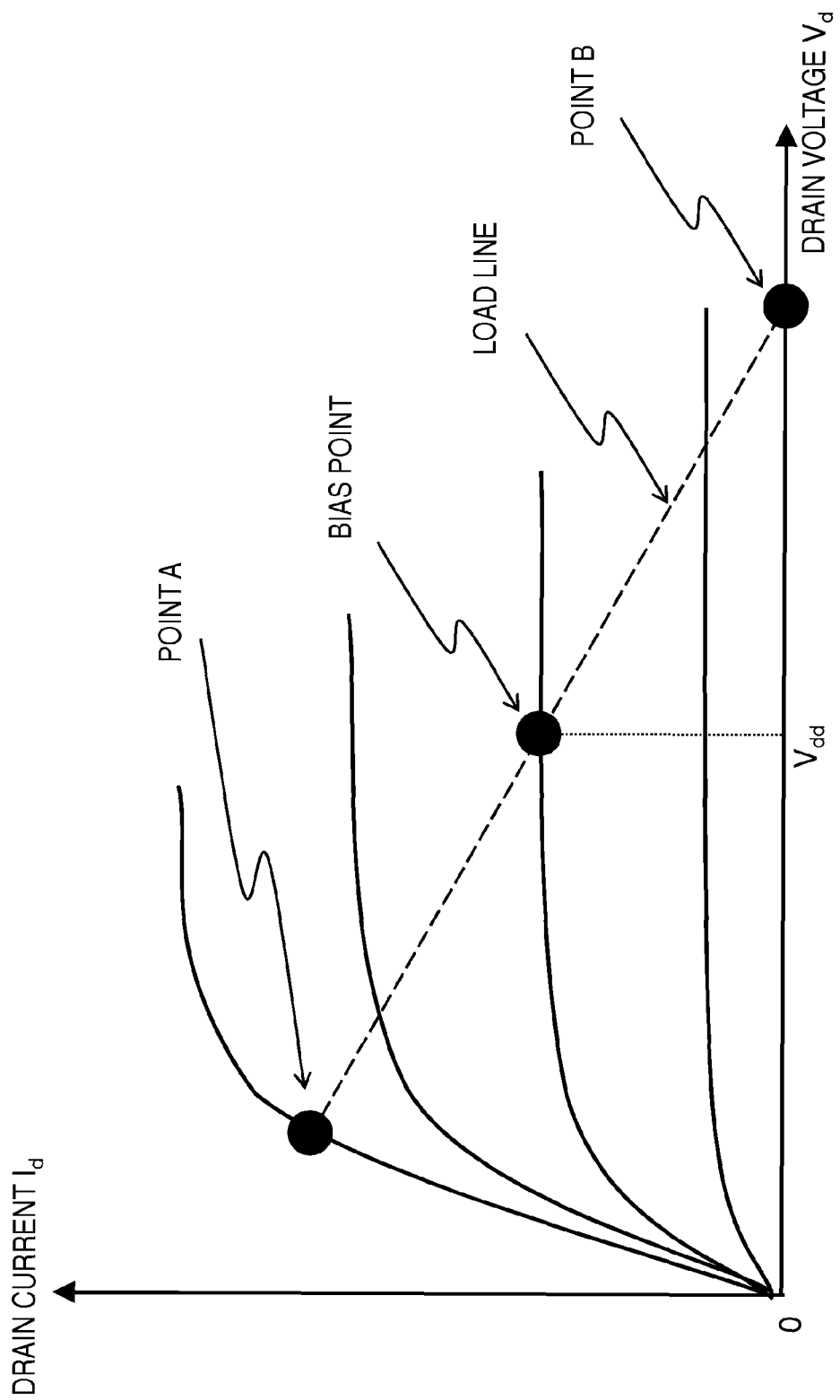
FIG. 5 is a descriptive diagram showing characteristics of a field-effect transistor 50 and modelization of a load line when a prescribed load is connected, with respect to FIG. 3.

When carriers in the field-effect transistor are electrons, in FIG. 5, during RF operation the field-effect transistor operates between point A and point B, along a load line centered on a bias point. At point B, the transistor is OFF, and at this time, between gate and drain, electrons are injected into surface traps in a semiconductor layer due to a large reverse bias voltage, and channel narrowing occurs. By applying a positive voltage to a field plate electrode, by a voltage dividing circuit, it is possible to suppress channel narrowing. Accordingly, it is possible to prevent a transient response phenomenon as in a current collapse or drain current variation after turning RF OFF.

Outlines of exemplary embodiments are as follows. The following specific exemplary embodiments are described in further detail, making reference to the drawings.

First Exemplary Embodiment

A description of a configuration of a semiconductor device according to a first exemplary embodiment is given using a circuit block diagram in FIG. 1 and a cross-sectional drawing showing the structure of a field-effect transistor in FIG. 2. According to the circuit block diagram of FIG. 1, the semiconductor device 10 according to the first exemplary embodiment is provided with a field-effect transistor (FET) 50 that has a field plate (FP) electrode. The field-effect transistor 50 is provided with a source electrode 102, a drain electrode 103, a gate electrode 105 and a field plate electrode 106. The source electrode (102) is connected to ground (GND) which is a reference potential, the gate electrode 105 is connected to a gate bias power supply ($V_{g\_g}$) via a choke inductor 120, and the drain electrode 103 is connected to a drain bias power supply ($V_{d\_d}$) via a choke inductor 121. A voltage dividing circuit 110 is provided between the drain bias power supply ($V_{d\_d}$) and ground (GND). The voltage dividing circuit 110 is provided with a first resistor 111 and a second resistor 112 connected in series between the drain bias power supply ($V_{d\_d}$) and ground (GND), and a connection point of the first resistor 111 and the second resistor 112 is connected to the field plate electrode 106 via a choke inductor 122. In FIG. 1, a high frequency signal RFin received by the gate electrode 105 is amplified by the field-effect transistor 50 and outputted as a high frequency output signal RFout from the drain electrode 103.

FIG. 2 is a cross-sectional diagram showing the structure of the field-effect transistor 50 of FIG. 1. The field-effect transistor 50 shown in FIG. 2 is a hetero-junction field-effect transistor that uses a nitride semiconductor. In the field-effect transistor 50, the source electrode 102, the drain electrode 103 and the gate electrode 105 are formed on a surface of an epi (epitaxial) substrate built up of layers, in order, of a buffer layer 1002, a GaN channel layer 1003 and an AlGaN electron supply layer 1004, on a substrate 1001. A preferable material for the substrate 1001 is SiC, sapphire, Si, or the like. A group-III nitride semiconductor substrate or the like, such as GaN, AlGaN etc. may also be used in the substrate 1001. As a preferable example of the buffer layer 1002, it is possible to use an AlN buffer layer. A 2-dimensional electron gas channel 101 is formed in the vicinity of an interface with the AlGaN electron supply layer 1004 of the GaN channel layer 1003.

The source electrode 102 and the drain electrode 103 are provided with a separation therebetween on the surface of the epi substrate 100, each being in ohmic contact with the AlGaN electron supply layer 1004. The gate electrode 105 is provided on the surface of the epi substrate 100 between the source electrode 102 and the drain electrode 103, and is Schottky-connected to the AlGaN electron supply layer 1004. Surfaces of the source electrode 102, the drain electrode 103 and the gate electrode 105, and the surface of the epi substrate 100 outside of regions where the respective electrodes are formed, are covered by a protective film (insulating film) 104, and the field plate electrode 106 is formed towards the drain electrode 103 from the gate electrode 105, on the protective film 104 surface, so that a portion thereof stretches over the gate electrode 105.

Operation of the First Exemplary Embodiment

Next, a description is given concerning operation of the semiconductor device 10 according to the first exemplary embodiment. The semiconductor device 10 according to the first exemplary embodiment functions as what is called an RF power amplifier, wherein, when RF power is inputted by a gate terminal in a state where a DC bias voltage is applied to each of a gate bias power supply ($V_{g\_g}$) and a drain bias power supply ($V_{d\_d}$), it is possible to extract the RF power, which has been amplified from a drain terminal. When a DC bias is applied by the drain bias power supply ($V_{d\_d}$), a DC bias voltage is applied to the drain electrode 103 and at the same time a direct current flows in the resistors 111 and 112 that are connected in series. From the fact that the resistors 111 and 112 are connected in series, a divided voltage $V_1$ applied to both ends of the resistor 111 and a divided voltage $V_2$ applied to both ends of the resistor 112, with the resistance value of the resistor 111 as $R_1$ and the resistance value of the resistor 112 as $R_2$, are given by the Equation 1 and Equation 2, respectively.

$$V_1 = \frac{R_1}{R_1 + R_2} V_{dd} = \left(1 + \frac{R_2}{R_1}\right)^{-1} V_{dd} \qquad \text{(Equation 1)}$$

$$V_2 = \frac{R_2}{R_1 + R_2} V_{dd} = \left(1 + \frac{R_1}{R_2}\right)^{-1} V_{dd} \quad \text{(Equation 2)}$$

Here, from the fact that a connection portion of the resistor 111 and the resistor 112 are connected to the field plate electrode 106, when the DC bias voltage $V_{d\ d}$ is applied, the voltage $V_{FP}$ applied to the field plate electrode 106 is equal to the divided voltage $V_2$ of $V_{d\ d}$ given by Equation 2, so that Equation 3 holds.

$$V_{FP} = V_2 = \left(1 + \frac{R_1}{R_2}\right)^{-1} V_{dd} \quad \text{(Equation 3)}$$

In other words, by appropriately selecting the ratio of the resistance value $R_1$ of the resistor 111 and the resistance value $R_2$ of the resistor 112, it is possible to arbitrarily control the voltage $V_{FP}$ applied to the field plate electrode 106 in a range of $0 \leq V_{FP} \leq V_{dd}$.

It is to be noted that since the power consumed by a direct current flowing in the resistors 111 and 112 from the drain bias power supply ($V_{d\ d}$) is lost power that does not contribute to amplification of the RF power, it is desirably as small as possible. Since the size of the power consumed by the direct current flowing in the resistor 111 and the resistor 112 is $V_{d\ d}^2/(R_1 + R_2)$, if the sum of the resistance value $R_1$ of the resistor 111 and the resistance value $R_2$ of the resistor 112 is large, the lost power can be made small. In configuring an RF power amplifier using the semiconductor device 1 according to the present exemplary embodiment, it is preferable that the sum of the resistance value R1 and the resistance value R2 be 1 kΩ or more.

Comparison of the First Exemplary Embodiment and Conventional Technology

Here, in order to describe in more detail principles of operation and effects of the first exemplary embodiment, a more detailed description is given using the drawings, concerning the transient phenomenon described as a topic of the disclosure. In the semiconductor device of FIG. 10 described as conventional technology, the transient response phenomenon can be described as occurring due to the capture/release of electrons with regard to traps (surface traps) present in an interface between a semiconductor layer 2 and an insulating film 16, in a region between a gate electrode 13 and a drain electrode 15. In other words, when a transistor is in an OFF state, electrons are injected into surface traps from the gate electrode 13, due to a large reverse bias voltage applied between the gate electrode 13 and the drain electrode 15, and surface potential is raised, so that a surface depletion layer enlarged thereby causes channel narrowing. Thereafter, when the field-effect transistor is changed to an ON state, immediately after the change to the ON state a surface depletion layer formed between the gate electrode 13 and the drain electrode 15 causes channel narrowing, so that the drain current becomes very small, the surface depletion layer reduces along with electrons being released from the surface traps, and the drain current gradually increases, in an occurrence of the transient response phenomenon.

From this, in a current collapse, the field-effect transistor is repeatedly turned ON and OFF at high frequencies of microwave regions, and since the release of electrons from the surface traps cannot follow the operational frequency, a phenomenon can be understood in which, due to electrons staying captured in the surface traps, the drain current decreases.

With regard to drain current variation after turning RF OFF, a phenomenon can be understood in which electrons are captured in surface traps during RF power operation, so that immediately after the RF power operation is turned OFF, the drain current becomes very small, but thereafter, along with electrons being released from the surface traps, the drain current gradually recovers.

Figure 15:
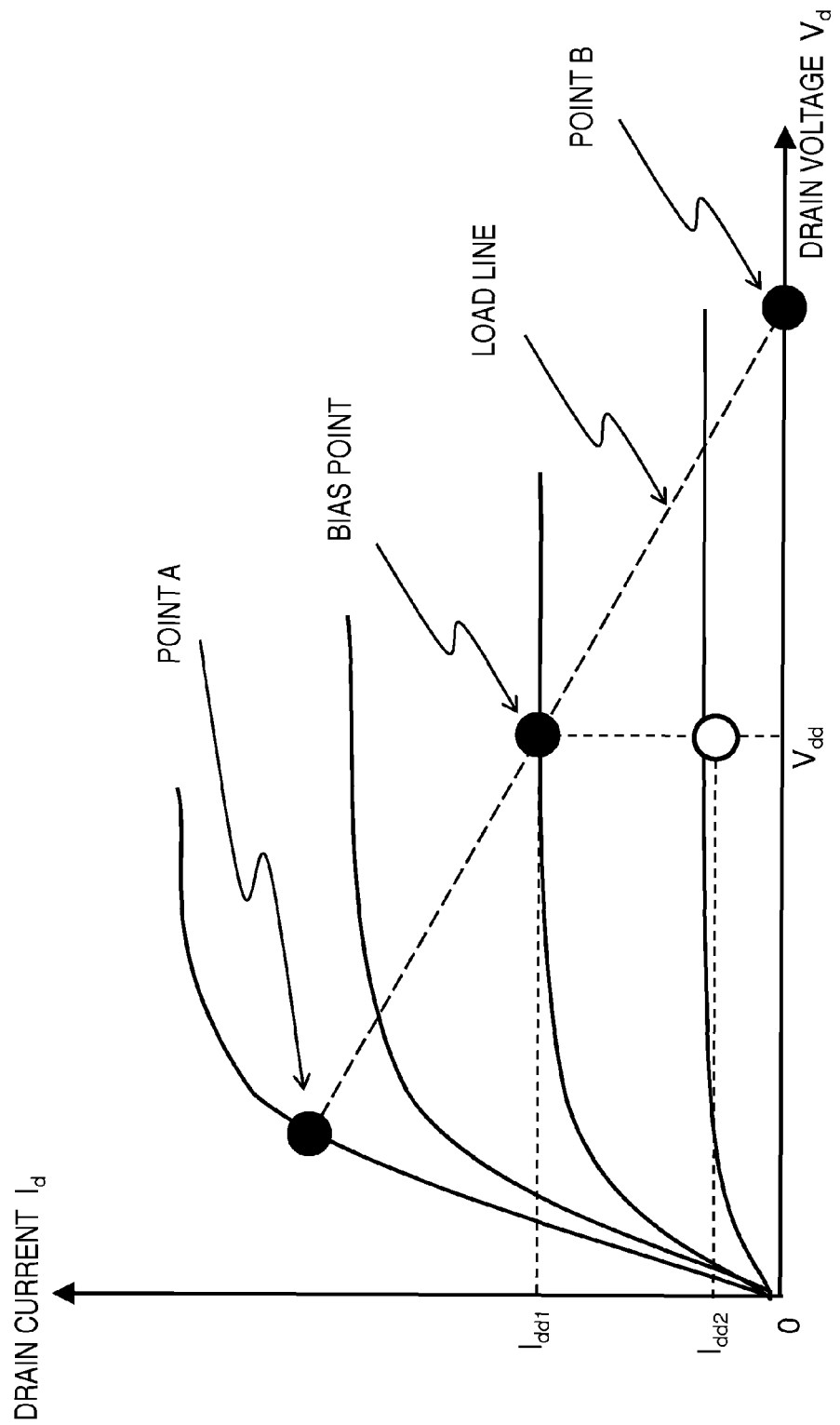
FIG. 15 is a diagram describing drain current variation after turning RF OFF.

A further description is given concerning the abovementioned transient response phenomenon using FIG. 15 in which modelization is done with regard to a load line of drain load and static characteristics of a field-effect transistor with respect to source-ground. In FIG. 15, in a case where a bias voltage $V_{g\ g}$ is applied to a gate and a bias voltage $V_{d\ d}$ is applied to a drain, in an RF signal OFF state, a prescribed drain current $I_{d\ d\ 1}$ flows. When an RF signal is inputted to the gate, the drain voltage $V_d$ and the drain current $I_d$ are considered to fluctuate along the load line between point A and point B (in actuality, the current decreases due to channel narrowing). At point A, the current flowing in the field-effect transistor is maximum. On the other hand, at point B, the drain current $I_d$ is zero, and the transistor is OFF. At this time, a large reverse bias voltage is applied between gate and drain, and electrons are captured in surface traps in the vicinity of the gate. When, after RF operation for some time, the RF signal inputted from the gate is stopped and the RF power operation is turned OFF, immediately thereafter, if the bias voltage $V_{d\ d}$ is applied to the drain and the bias voltage $V_{g\ g}$ is applied to the gate, the drain current at that time is $I_{d\ d\ 2}$ and is a value that is very small in comparison to the $I_{d\ d\ 1}$ of before the RF power was ON. Thereafter, if the RF power OFF state continues, electrons are released from the surface traps, and the drain current gradually increases to approach the $I_{d\ d\ 1}$ of before the RF power was ON.

A description is given concerning a preferable field plate electrode arrangement for suppressing the abovementioned transient phenomenon investigated by the inventor. Here, a description is given assuming use of a GaN field-effect transistor in depression mode (normally on) having a field plate electrode, with source grounded. The field plate electrode has a function to reduce the surface depletion layer by a bias voltage thereof and to suppress drain current decrease. Therefore, in order to effectively obtain this function of the field plate electrode, the following are effective: in a range where an adequate breakdown voltage can be obtained, (a) applying a positive voltage to the field plate electrode 106 when the transistor is in an ON state irrespective of the RF power being ON or OFF, (b) arranging the field plate electrode 106 in the vicinity of the gate electrode 105, and (c) making the insulating film 104 thin. The above (a) is because it is possible to further reduce the surface depletion layer by applying a positive voltage to the field plate electrode. The above (b) is because channel narrowing due to the surface depletion layer is stronger in the vicinity of the gate electrode 105, since electrons are injected from the gate electrode 105 to surface traps in an OFF state. The above (c) is because, for the same positive voltage applied to the field plate electrode, a thinner insulating film 104 can lower surface potential to a greater extent, and reduce the surface depletion layer. Here, if the insulating film 104 is too thin, there is a possibility of a tunnel current flowing in the insulating film 104, and a leak path being formed between the field plate electrode 106 and a 2-dimensional electron gas channel 101. In order to suppress this tunnel current, it is desirable that the thickness of the insulating film 104 be 5 nm or more. The thickness of the insulating film 104 between the field plate electrode 106 and the gate electrode 105 can be made thinner than the thickness of the insulating film 104 between the field plate electrode 106 and the epi substrate 100. By so doing, the field plate electrode 106 can be made to further approach the gate electrode 105 side, and it is possible to further suppress channel narrowing that occurs significantly in the vicinity of the gate. Since channel narrowing occurs on a drain side of the gate electrode 105, it is desirable that the field plate electrode 106 in particular be formed on the drain side of the gate electrode 105. That is, in a planar view, at least a part of the field plate electrode is formed between the gate electrode 105 and the drain electrode 103.

Figure 10:
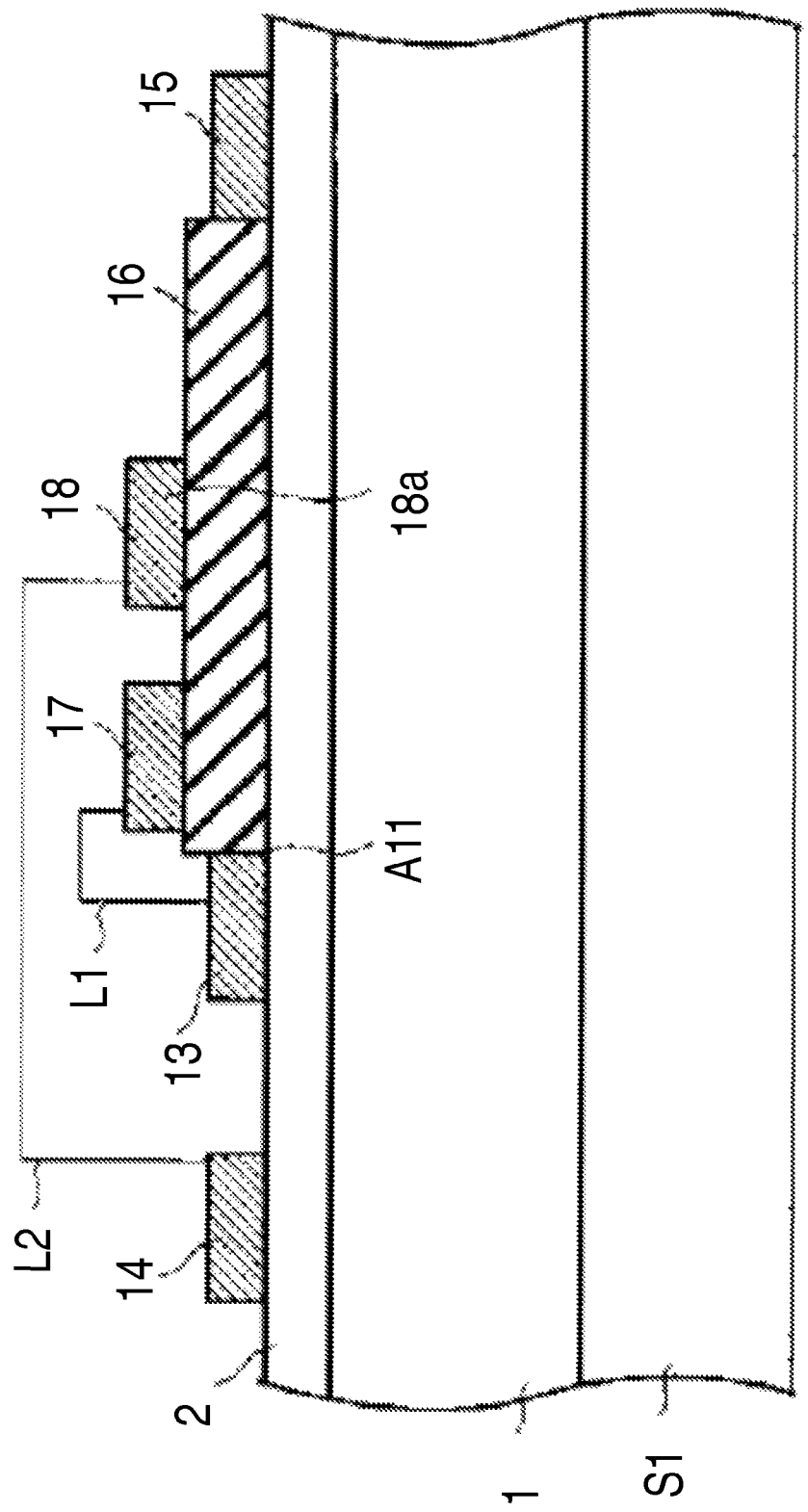
FIG. 10 is a cross-sectional diagram schematically showing a semiconductor device having conventional field plate electrodes, as described in Patent Literature 3.
Figure 11:
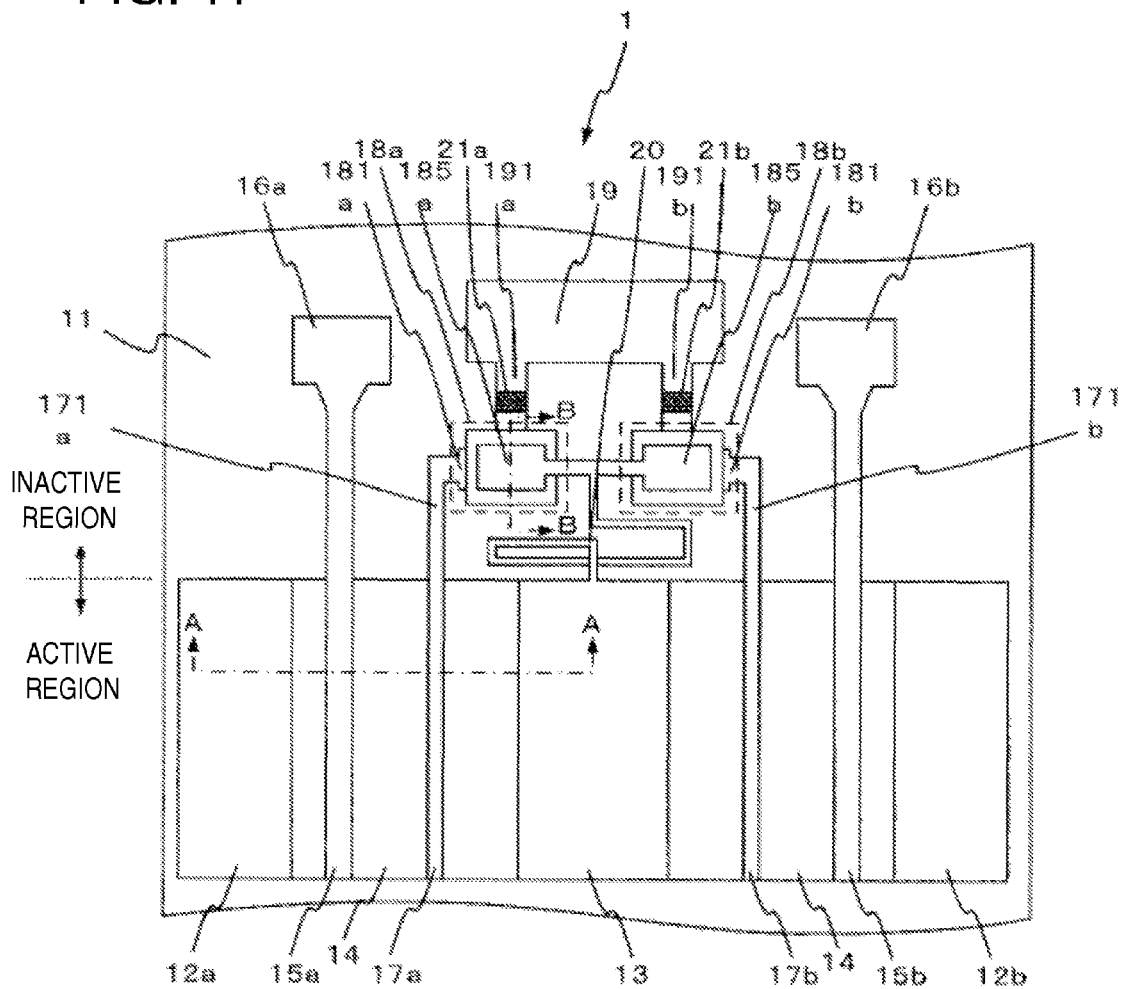
FIG. 11 is a plane view of a conventional semiconductor device in which an inverse voltage waveform having a larger amplitude than a gate electrode is applied to a field plate electrode as described in Patent Literature 4, to obtain an electric field relaxation effect.
Figure 12A:
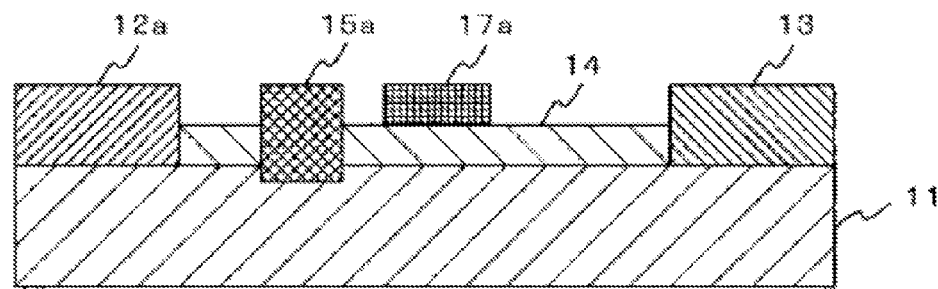
FIG. 12A is a cross-sectional view A-A.
Figure 12B:
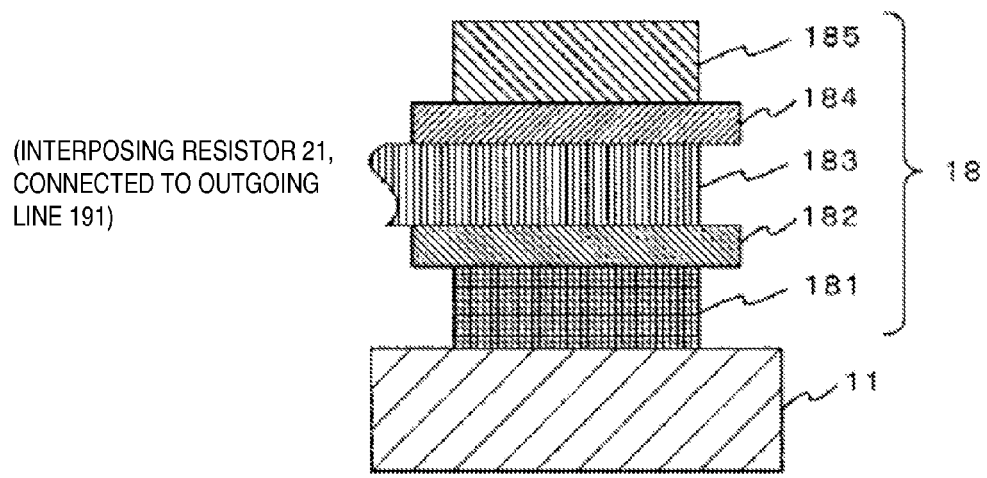
FIG. 12B is a cross-sectional view B-B.

With regard to the abovementioned transient phenomenon, in the semiconductor device described in Patent Literature 3 shown in FIG. 10, by a first field plate electrode 13 and a second field plate electrode 14 being controlled to have the same potential as the gate electrode 13 and source electrode 14 respectively, it is considered that when the field-effect transistor changes from an OFF state to an ON state, since the surface depletion layer is instantly reduced directly under a first field plate electrode 17 and a second field plate electrode 18, it is possible to suppress drain current decrease due to the surface depletion layer and, as a result, it is possible to satisfactorily suppress the transient response phenomenon. It is to be noted that Patent Literature 3 describes an example in which two field plate electrodes are provided, but it is considered that a satisfactory result can be obtained even with only one thereof.

However, in the field-effect transistor having the field plate electrodes described in Patent Literature 3 shown in FIG. 10, there is a problem in that it is not possible to apply a large positive voltage to a field plate electrode, and the effect of suppressing the drain current decrease is limited. In this field-effect transistor, the first field plate electrode 17 is electrically shorted with the gate electrode 13, and always has the same potential. Therefore, with a bias condition of obtaining a large drain current determining a current collapse, for example, the potential of the first field plate electrode 17 is small, being about +1V at most, and it is not possible to completely eliminate drain current decrease due to current collapse. With a bias condition determining drain current variation after RF is OFF, the potential of the first field plate electrode is a negative voltage, and there is almost no effect of suppressing drain current decrease. On the other hand, the second field plate electrode 18 is electrically shorted with the source electrode 14, and always has the same potential. Here, since the source is grounded, the potential of the second field plate electrode 18 is always 0V, and since a large positive voltage is not applied in an ON state, the effect of suppressing the drain current decrease is limited. In Patent Literature 3, distances between respective electrodes, and the thickness of the insulating film 16 etc. are not specifically described, but as a result of our careful investigations with a similar structure, the amount of decrease in drain current due to current collapse was approximately 50%, the amount of decrease in drain current due to drain current variation after turning RF OFF was approximately 80%, and the time until recovery to a drain current prior to RF power operation was approximately 120 seconds.

Figure 13:
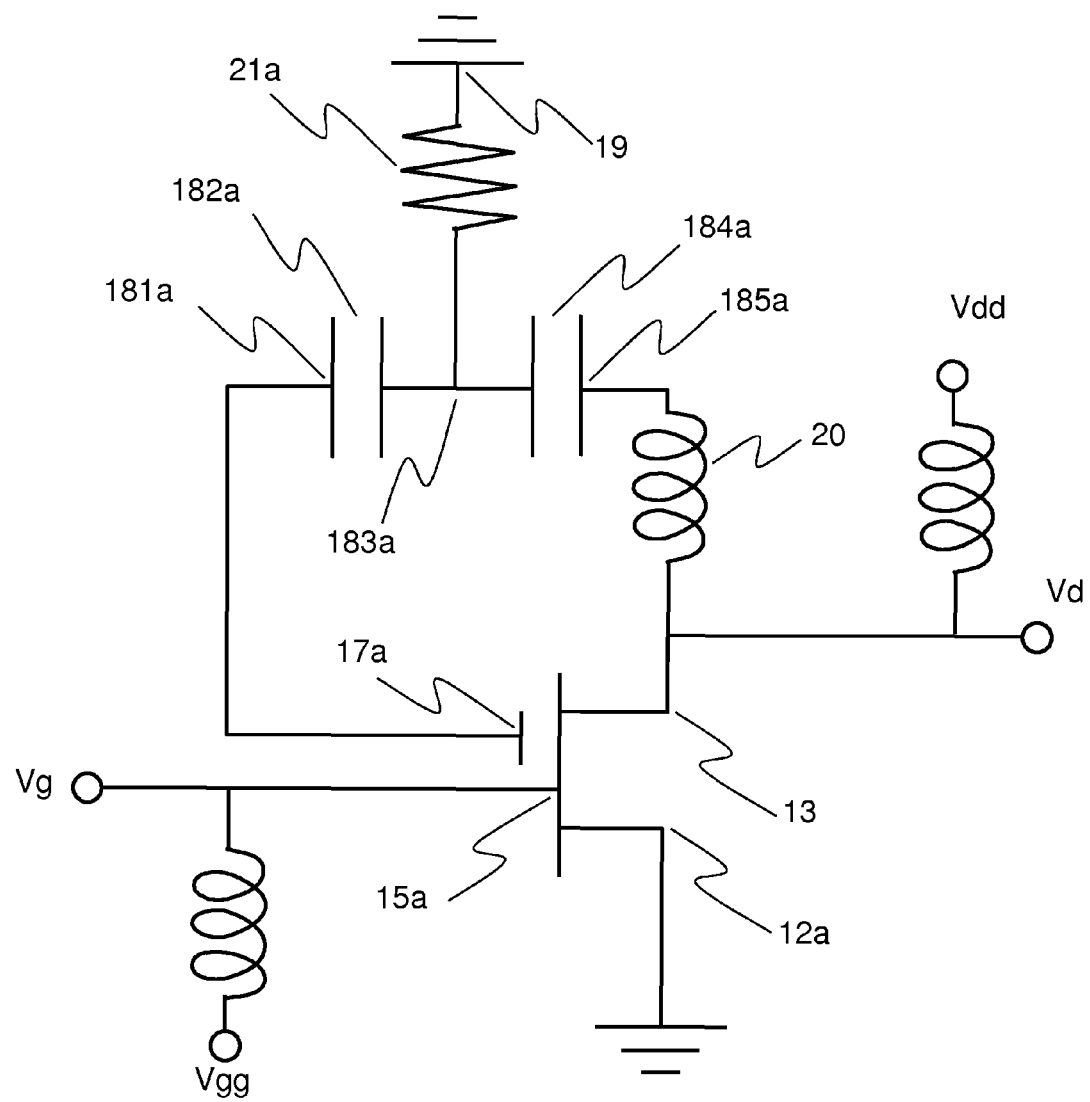
FIG. 13 is an equivalent circuit diagram with regard to the circuit of FIG. 11, according to an analysis by the inventor.
Figure 14A:
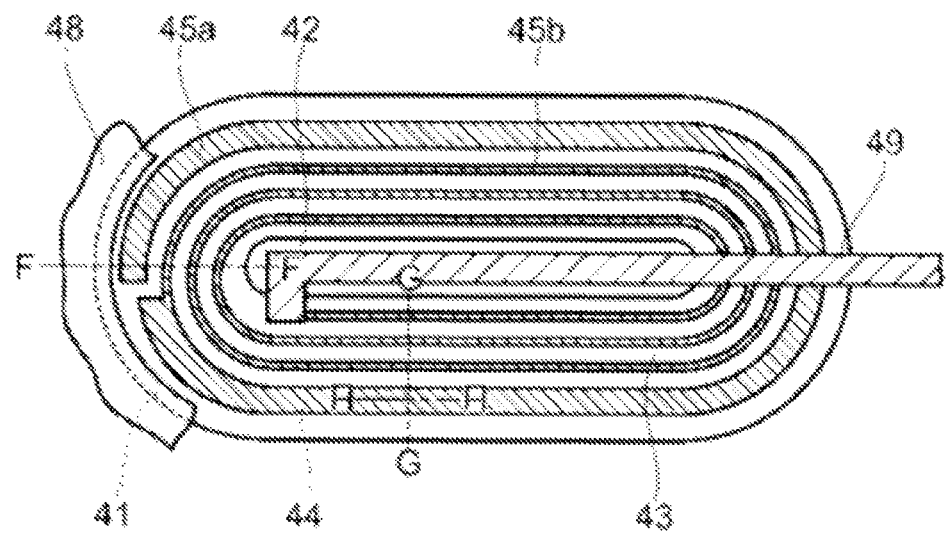
FIG. 14A is a plane view and FIG. 14B is a cross-sectional view F-F, of a semiconductor device described in Patent Literature 5.
Figure 14B:
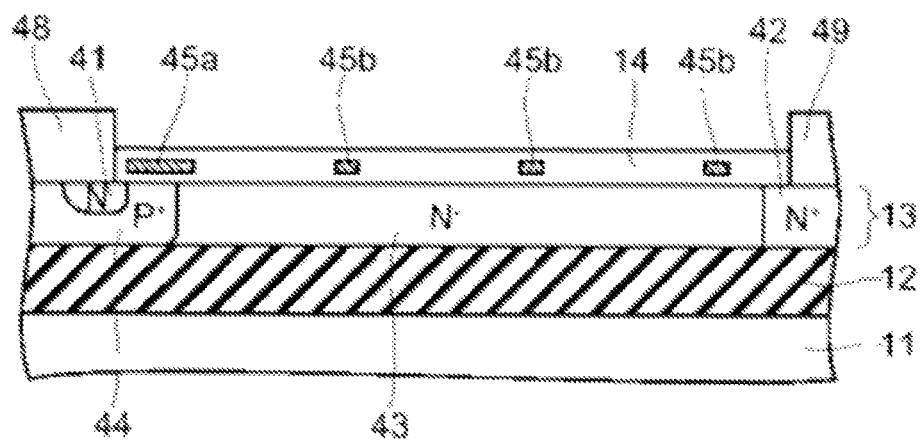

In the semiconductor device described in Patent Literature 4, an effect of suppressing drain current decrease with respect to the drain current variation after turning RF OFF is not obtained. A reason for this is that a positive voltage cannot be applied to a field plate electrode when RF is OFF, the transistor is in an ON state, and only a DC bias voltage applied. As shown in FIG. 13, Patent Literature 4 has a configuration in which a field plate electrode 17a is connected to a drain electrode 13 via MIM capacitors 181a and 184a that are stacked in two layers, and an intermediate layer 183a with regard to the MIM capacitors is connected to a grounding electrode 19. Therefore, when only a DC bias voltage is applied in an RF OFF state, the drain voltage applies to both ends of the MIM capacitor 184a, and the intermediate layer 183a has the same potential as the grounding electrode 19, that is, 0V. This means that even if a DC bias voltage is applied to the drain electrode 13, there is no effect on the potential of the field plate electrode 17a. That is, with drain current variation after turning RF OFF, in a state where a transistor is ON with RF OFF and only a DC bias voltage applied, it is not possible to decrease the surface depletion layer even if a positive voltage is applied to the field plate electrode 17a, and an effect of suppressing the drain current decrease is not obtained.

Second, in the configuration described in Patent Literature 4, the effect of suppressing a drain current decrease due to current collapse is limited. A reason for this is that, since the positive voltage applied to the field plate electrode 17 when the field-effect transistor is in an ON state is small, the surface depletion layer is reduced and the effect of suppressing the drain current decrease is small. As described above, in a configuration of the conventional technology, a voltage applied to the field plate electrodes 17a and 17b at a time of an RF power operation has a minimum of 0V at a point where signal amplitude in a load line has maximum current and minimum voltage. That is, at this point, as disclosed in Patent Literature 3, the potential is the same as when the field plate electrode is electrically shorted with the source electrode, and an effect of reducing the surface depletion layer and suppressing the drain current decrease is limited.

Third, in the configuration described in Patent Literature 4, it is difficult to reduce the surface depletion layer in the vicinity of a gate by a field plate electrode, and an effect of suppressing the drain current decrease is limited. A reason for this is that since the maximum voltage applied to the field plate electrode is large, it is necessary to arrange the field plate electrode with an adequate distance from the gate electrode. As described above, in a configuration of the conventional technology, voltage applied to the field plate electrodes 17a and 17b at a time of an RF power operation, is maximum at a point where signal amplitude on a load line has minimum current and maximum voltage. For example, in order to have a maximum of 20V where $V_{d\,s\,b}$=10V, the maximum value of voltage applied to the field plate electrodes 17a and 17b is double the value $V_{d\,s\,b}$. Thus, when a large voltage is applied to the field plate electrodes 17a and 17b, since the potential difference between the gate electrodes 15a and 15b increases and breakdown can easily occur, it is necessary that the distance between the field plate electrodes 17a and 17b, and the gate electrodes 15a and 15b be sufficiently large. That is, it is not possible to arrange the field plate electrodes 17a and 17b in the vicinity of edges of the gate electrodes 15a and 15b where the surface depletion layer is largest, and the effect of decreasing the surface depletion layer by the field plate electrodes 17a and 17b, and suppressing the drain current decrease becomes small.

In Patent Literature 4, the distances between the respective electrodes, and the thickness of the insulating film 14 etc. are not specifically described, but as a result of our careful investigations with a similar structure, the amount of decrease in drain current due to current collapse was approximately 45%, the amount of decrease in drain current due to drain current variation after turning RF OFF was approximately 80%, and the time until recovery to a drain current before RF power operation was approximately 110 seconds.

In the semiconductor device described in Patent Literature 5, in realizing an improvement in breakdown voltage between gate and drain, the voltage between gate and drain is divided and applied to a field plate electrode. In this case, the potential of the field plate electrode arranged in the vicinity of the gate is almost the same potential as the gate electrode, and is not effective in suppressing drain current decrease due to the transient response phenomenon.

In contrast to the respective conventional technologies described above, the semiconductor device of the first exemplary embodiment can obtain effects as described below.

First, it is possible to suppress drain current decrease with regard to drain current variation after turning RF OFF. A reason for this is that an adequate positive voltage necessary for suppressing the drain current decrease can be applied to the field plate electrode 106 with RF OFF and the transistor in an ON state with only a DC bias voltage applied. As shown in Equation 3, in a configuration of the present exemplary embodiment, even without RF input, a voltage $V_{F\ P}$ is applied to the field plate electrode 106 by applying only a DC bias voltage $V_{d\ d}$. By appropriately selecting the ratio of the resistance value $R_1$ of the resistor 111 and the resistance value $R_2$ of the resistor 112, it is possible to arbitrarily control the voltage $V_{F\ P}$ applied to the field plate electrode 106 in a range of $0 \leq V_{F\ P} \leq V_{d\ d}$. In this way, with drain current variation after turning RF OFF, in a state where the transistor is ON with RF OFF and only a DC bias voltage applied, it is possible to apply an adequate positive voltage that is required to the field plate electrode 106, and as a result, even in a state where the DC bias voltage only is applied, an effect is obtained in which it is possible to reduce the surface depletion layer and the drain current decrease is suppressed.

Second, it is possible to adequately improve an effect of suppressing drain current decrease due to current collapse. A reason for this is that it is possible to apply a large positive voltage to the field plate electrode 106, without relying on signal amplitude at a time of an RF power operation. As shown in FIG. 1, since the drain bias power supply ($V_{d\ d}$) and the resistor 111 and the resistor 112 are isolated from an RF signal path by choke inductors 121 and 122, a voltage $V_{F\ P}$ given by Equation 3 is applied to the field plate electrode 106, irrespective of signal amplitude at the time of an RF power operation. Therefore by appropriately selecting the ratio of the resistance value $R_1$ of the resistor 111 and the resistance value $R_2$ of the resistor 112, it is possible to apply a positive voltage of desired magnitude to the field plate electrode 106, and as a result, to obtain an effect of reducing the surface depletion layer and suppressing the drain current decrease, even at a time of an RF power operation.

Third, by the fact that the distance between the gate electrode 105 and the field plate electrode 106 must be large, it is possible to avoid limitation of the effect of suppressing the drain current decrease, and to maximize the effect of suppressing the transient response phenomenon due to the field plate electrode 106. A reason for this is that it is possible to arbitrarily control the voltage $V_{F\ P}$ applied to the field plate electrode 106. As described above, in a configuration of the present exemplary embodiment, irrespective of whether or not there is RF input, since the voltage $V_{FP}$ given by Equation 3 is applied to the field plate electrode 106, by appropriately selecting the ratio of the resistance value $R_1$ of the resistor 111 and the resistance value $R_2$ of the resistor 112, it is possible to arbitrarily control the voltage $V_{F\ P}$ applied to the field plate electrode 106 in a range of $0 \leq V_{F\ P} \leq V_{d\ d}$. That is, as shown in FIG. 2, even in a case where the field plate electrode 106 is arranged adjacently to the gate electrode 105 so that a part thereof covers the gate electrode 105, it is possible to control the $V_{F\ P}$ to a range where there is no breakdown between the field plate electrode 106 and the gate electrode 105. In this way, as a result of being able to arrange the field plate electrode 106 in the vicinity of an edge of the gate electrode 105 where the surface depletion layer is largest, it is possible to reduce the surface depletion layer due to the field plate electrode 106 and to maximize an effect of suppressing the drain current decrease.

In the configuration of the present exemplary embodiment, as a result of our careful investigations, it is possible to reduce the amount of decrease in drain current due to a current collapse to approximately 10%. Furthermore, it is possible to reduce the amount of decrease in drain current with regard to drain current variation after turning RF OFF, to approximately 20%, and to reduce the time until recovery to the drain current before the RF power operation, to approximately 5 seconds.

Second Exemplary Embodiment

Figure 3:
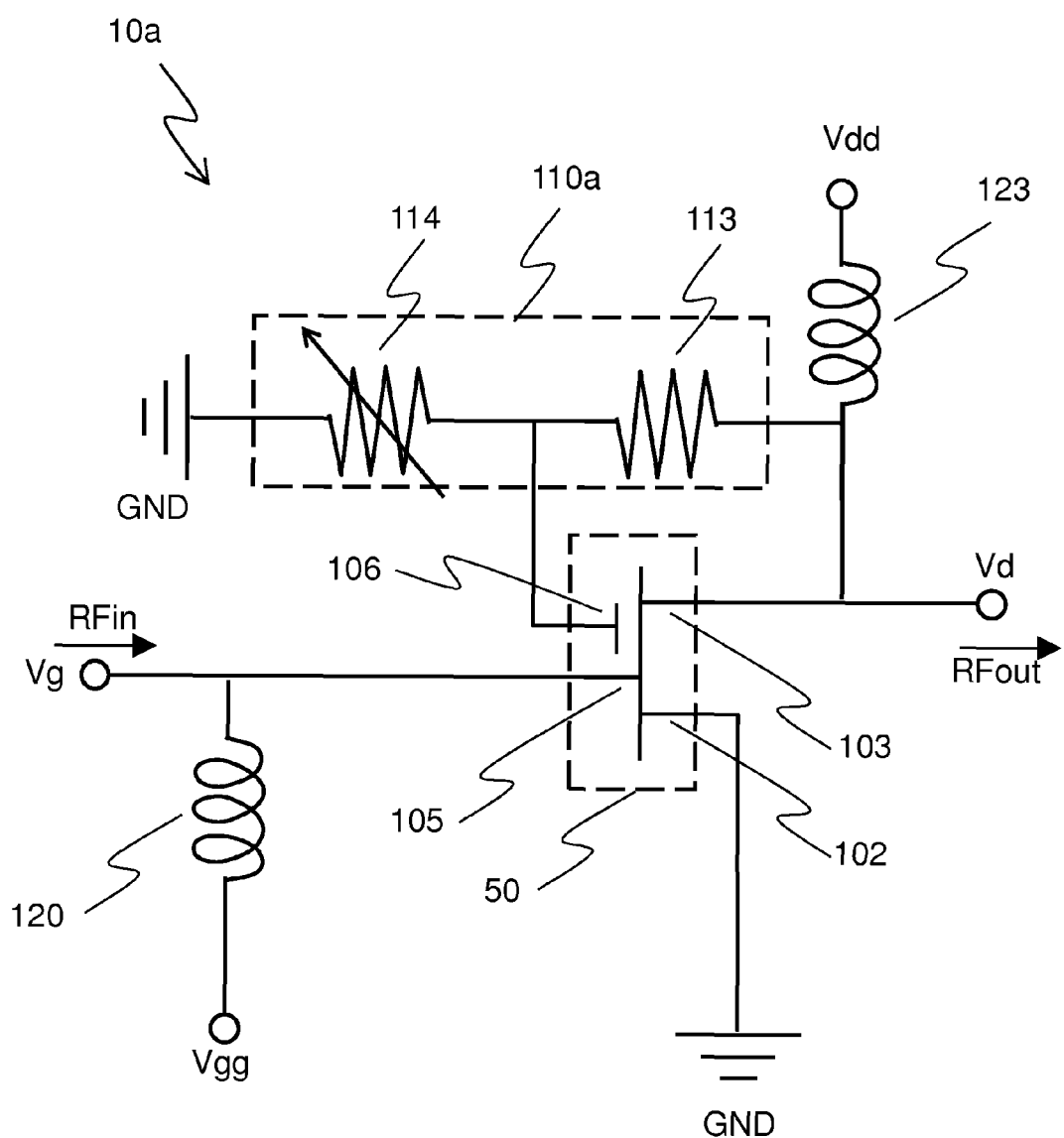
FIG. 3 is a circuit block diagram of a semiconductor device according to a second exemplary embodiment.

FIG. 3 is a circuit block diagram of a semiconductor device according to a second exemplary embodiment. A description is given concerning a configuration of the semiconductor device according to the second exemplary embodiment using FIG. 3.

The semiconductor device 10a according to the second exemplary embodiment is provided with a field-effect transistor 50 having a field plate electrode similar to the first exemplary embodiment, and circuit elements similar to the first exemplary embodiment are connected to a source electrode 102 and a gate electrode 105. A drain electrode 103 is connected to a drain bias power supply ($V_{d\ d}$) via a choke inductor 123. A voltage dividing circuit 110a is connected between the drain electrode 103 and ground (GND). The voltage dividing circuit 110a is provided with a first resistor 113 and a second resistor 114 connected in series between the drain electrode 103 and ground (GND). The second resistor is a variable resistor 114, and the variable resistor 114 uses a non-linear element where a resistance value increases when applied voltage is small, and a resistance value decreases when applied voltage is large. That is, it is preferable to use a non-linear element having a constant voltage characteristic such that voltage between terminals is relatively constant even if current value flowing in the resistor changes. Specifically a semiconductor diode, and more specifically, a Schottky barrier diode, a pn junction diode, a PIN diode or the like may be cited, and by connecting a cathode electrode to a ground side and an anode electrode to a resistor 113 side, usage of the variable resistor 114 is possible. Usage is also possible by connecting an anode electrode of a zener diode to a ground side, and by connecting a cathode electrode to a resistor 113 side. A connection part of the resistor 113 and the variable resistor 114 is connected to the field plate electrode 106.

It is to be noted that, similar to the first exemplary embodiment, a hetero-junction field-effect transistor using a nitride semiconductor is used in the field-effect transistor 50.

Operation of the Second Exemplary Embodiment

The semiconductor device 10a according to the second exemplary embodiment, similar to the semiconductor device 10 according to the first exemplary embodiment, functions as an RF power amplifier. When a voltage $V_d$ is applied to the drain electrode 103, a current flows in the resistor 113 and the variable resistor 114 that are connected in series. A divided voltage $V_3$ applied to the two ends of the resistor 113 and a divided voltage $V_4$ applied to the two ends of the variable resistor 114, with a resistance value of the resistor 113 of $R_3$, and a resistance value of the resistor 114 of $R_4$, can be respectively represented by Equation 4 and Equation 5, similar to the first exemplary embodiment.

$$V_3 = \frac{R_3}{R_3 + R_4} V_d = \left(1 + \frac{R_4}{R_3}\right)^{-1} V_d \quad \text{(Equation 4)}$$

$$V_4 = \frac{R_4}{R_3 + R_4} V_d = \left(1 + \frac{R_3}{R_4}\right)^{-1} V_d \quad \text{(Equation 5)}$$

A voltage $V_{FP}$ applied to the field plate electrode 106 can be represented by Equation 6 similar to the first exemplary embodiment.

$$V_{FP} = V_4 = \left(1 + \frac{R_3}{R_4}\right)^{-1} V_d \quad \text{(Equation 6)}$$

In a state where a DC bias voltage only is applied, with no RF input, since $V_d = V_{d\_d}$, from Equation 6, the voltage applied to the field plate electrode 106 is the same as in Equation 3. That is, in the semiconductor device 2 according to the present exemplary embodiment, similar to the first exemplary embodiment, by appropriately selecting the ratio of the resistance value $R_3$ of the resistor 113 and the resistance value $R_4$ of the resistor 114, it is possible to arbitrarily control the voltage $V_{F\_P}$ applied to the field plate electrode 106 in a range of $0 \leq V_{F\_P} \leq V_{d\_d}$. On the other hand, in the semiconductor device 10a according to the present exemplary embodiment, since there is no choke inductor between a connection part of the resistor 113 and the variable resistor 114, and the field plate electrode 106, and these are not isolated from an RF signal path, operation when RF is inputted differs from the first exemplary embodiment.

Figure 4:
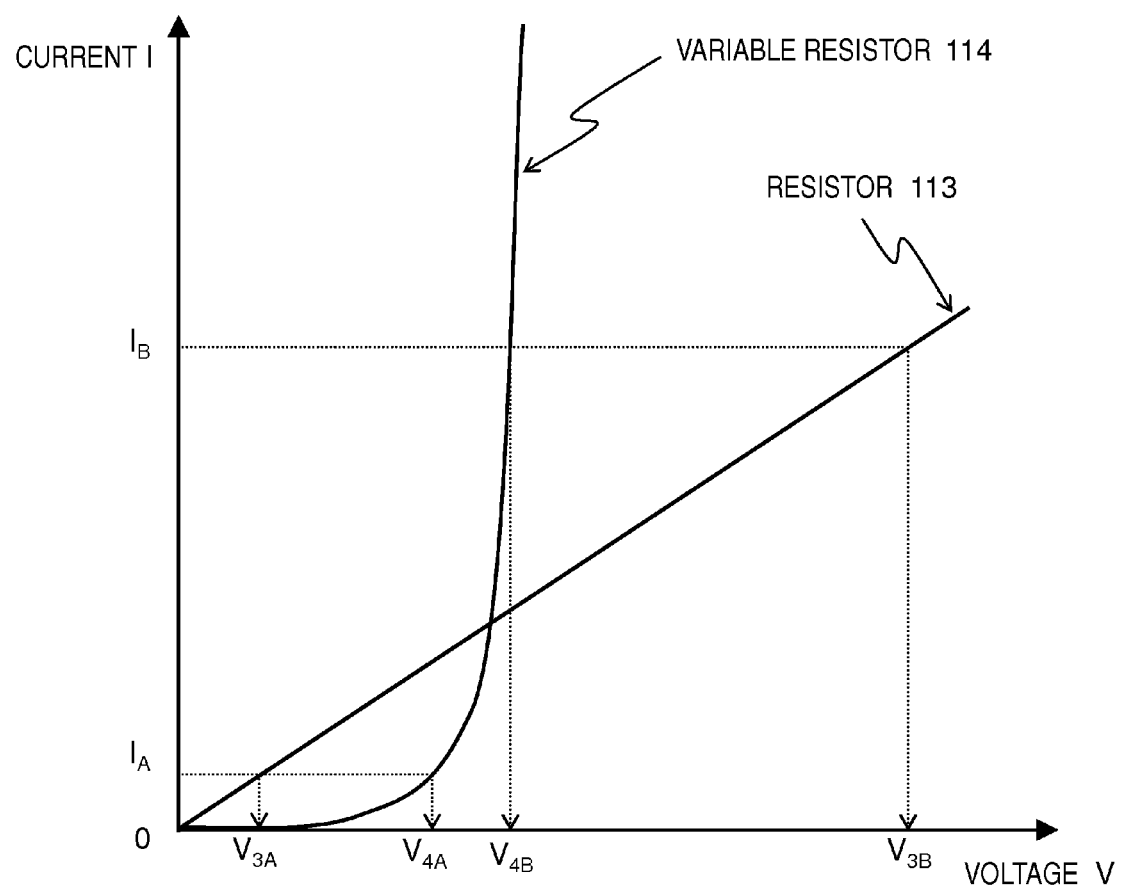
FIG. 4 is a descriptive diagram schematically showing the relationship between current and voltage applied to the two ends of a resistor 113 and a variable resistor 114, with respect to FIG. 3.

A description is given below of operation of the semiconductor device 10a at a time of an RF power operation, using FIG. 4 and FIG. 5. FIG. 4 is a descriptive diagram schematically showing a relationship between flowing current and voltage applied to the two ends of each of the resistor 113 and the variable resistor 114, and FIG. 5 is a descriptive diagram showing characteristics of a field-effect transistor and modelization of a load line when a prescribed load is connected.

As shown in FIG. 4, since the resistance value $R_3$ of the resistor 113 is constant, the current increases at a constant slope along with increase in voltage thereof. On the other hand, in the variable resistor 114, when an applied voltage is small, since the resistance value $R_4$ is large the current flowing is small; and since the resistance value $R_4$ becomes small as the applied voltage becomes large, the current that flows increases rapidly. In the present exemplary embodiment, since the resistor 113 and the variable resistor 114 are connected in series, and the same current flows in each thereof, when the flowing current is small ($I_A$), a divided voltage $V_{4\_A}$ applied to the variable resistor 114 is larger than a divided voltage $V_{3\_A}$ applied to the resistor 113. Conversely, when the current flowing is large ($I_B$), the divided voltage $V_{3\_B}$ applied to the resistor 113 is larger than the divided voltage $V_{4\_B}$ applied to the variable resistor 114.

When an RF power operation is performed, as shown in FIG. 5, the voltage ($V_d$) of the drain electrode 103 changes in accordance with signal amplitude on the load line, and in accordance with this, the current flowing in the resistor 113 and the variable resistor 14 that are connected in series, changes. That is, in an ON state (point A) in which the drain voltage ($V_d$) is minimum, the current flowing in the resistor 113 and the variable resistor 114 is small (corresponding to $I_A$ in FIG. 4), and in an OFF state (point B) in which the drain voltage ($V_d$) is maximum, the current flowing in the resistor 113 and the variable resistor 114 is large (corresponding to $I_B$ in FIG. 4). Therefore, since the voltage $V_{F\_P}$ applied to the field plate electrode 106 is equal to the divided voltage $V_4$ applied to the variable resistor (Equation 6), a comparatively large divided voltage is applied in the ON state (point A) where the drain voltage ($V_d$) is minimum, to the field plate electrode 106 ($V_{F\_P} = V_{4\_A}$), and in the OFF state (point B) where the drain voltage ($V_d$) is maximum, $V_{F\_P}$ hardly increases ($V_{F\_P} = V_{4\_B}$)

It is to be noted that in the semiconductor device 10a according to the present exemplary embodiment, since a current flows in the resistor 113 and the variable resistor 114 that are connected in series, loss of power thereby occurs. In order to decrease this power loss, it is desirable to increase as much as possible the resistance value $R_3$ of the resistor 113 and the resistance value $R_4$ of the variable resistor 114. Since the variable resistor 114 uses a characteristic wherein resistance decreases according to a bias condition, it is more desirable to increase the resistance value $R_3$ in order to decrease power loss. In configuring an RF power amplifier using the semiconductor device 10a according to the present exemplary embodiment, it is preferable that the resistance value $R_3$ be 1 k$\Omega$ or more.

Mechanism and Effects of the Second Exemplary Embodiment

Effects similar to the first exemplary embodiment can be obtained in the present exemplary embodiment also. As described above, in a case where there is RF input, operation is different from the first exemplary embodiment; voltage applied to the field plate electrode 106 changes in accordance with signal amplitude on a load line, but a comparatively large divided voltage is applied in the ON state (point A) where the drain voltage ($V_d$) is minimum ($V_{F\_P} = V_{4\_A}$), and in the OFF state (point B) where the drain voltage ($V_d$) is maximum, $V_{F\_P}$ hardly increases ($V_{F\_P} = V_{4\_B}$). Therefore, in a case where there is RF input, since it is possible to apply an adequate positive voltage that is required to the field plate electrode 106 in the ON state, an effect is obtained of suppressing drain current decrease due to current collapse, similar to the first exemplary embodiment. Furthermore, since voltage applied to the field plate electrode 106 in the OFF state can be made small, similar to the first exemplary embodiment, it is possible to arrange the field plate electrode 106 in the vicinity of the edge of the gate electrode 105, and to maximize the effect of suppressing the drain current decrease.

Moreover, in the present exemplary embodiment, since it is possible to have few choke inductors in contrast to the first exemplary embodiment, it is possible to reduce the size of the semiconductor device and to decrease manufacturing cost.

Third Exemplary Embodiment

Figure 6:
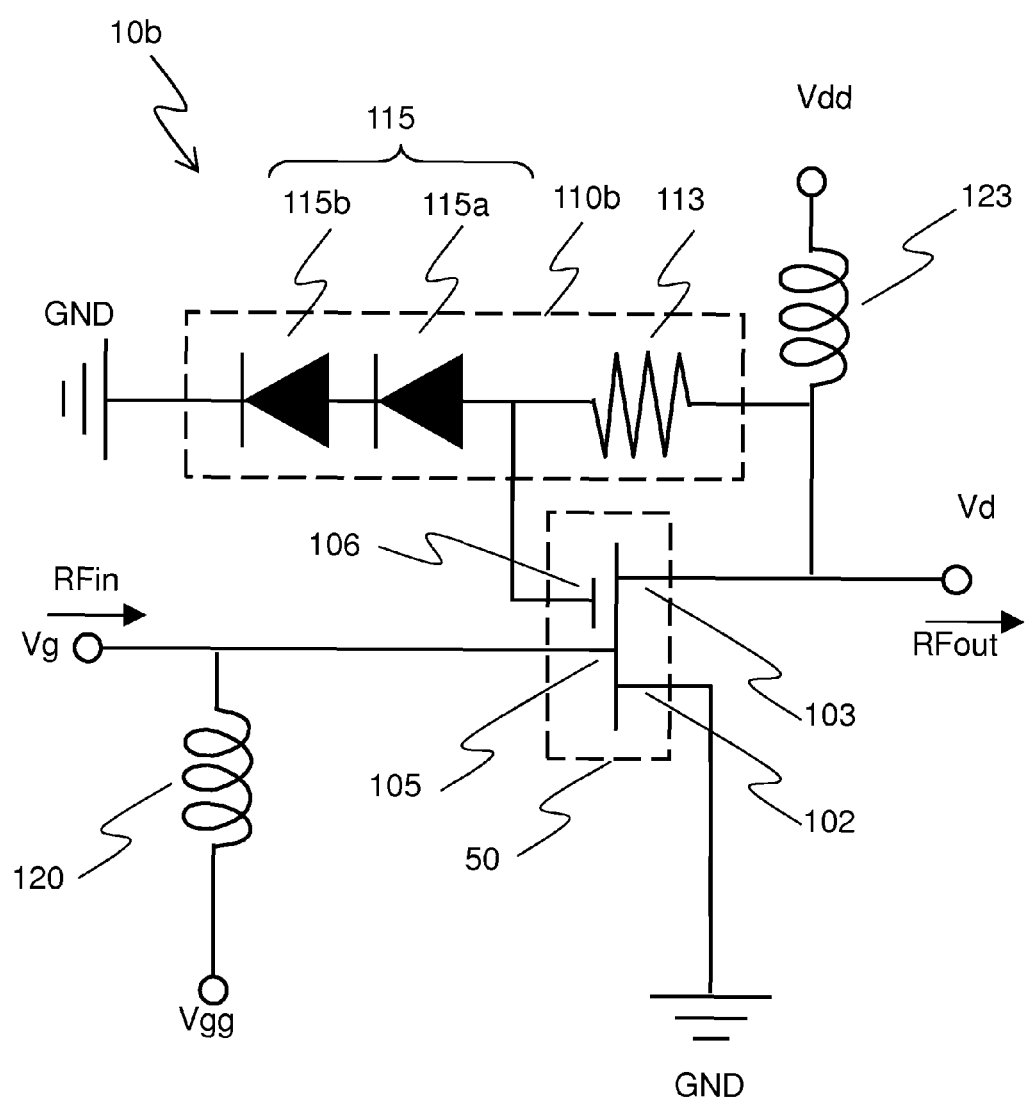
FIG. 6 is a circuit block diagram of a semiconductor device according to a third exemplary embodiment.

FIG. 6 is a circuit block diagram of a semiconductor device according to a third exemplary embodiment. A description is given of a configuration of the semiconductor device according to the third exemplary embodiment, using FIG. 6.

The semiconductor device 10b according to the third exemplary embodiment has a configuration similar to the second exemplary embodiment, with the variable resistor 114 configured as diodes 115 where two diodes 115a and 115b are connected in series. For both the two diodes 115a and 115b, cathode electrodes are connected to a ground side and anode electrodes are connected to a resistor 113 side. FIG. 6 shows an example in which the diodes 115 are configured by the two diodes 115a and 115b, but a configuration is also possible with 3 or more diodes. In the present exemplary embodiment, a hetero-junction field-effect transistor using a nitride semiconductor is used as the field-effect transistor 50, similar to the first exemplary embodiment.

Operation of the Third Exemplary Embodiment

The semiconductor device 10b according to the present exemplary embodiment, similar to the semiconductor devices 10 and 10a according to the first and second exemplary embodiments, also functions as an RF power amplifier. In the present exemplary embodiment, for both the diode 115a and the diode 115b, cathode electrodes are connected to a ground side, and anode electrodes are connected to a resistor 113 side, so that the diodes 115 realize a function similar to the variable resistor 114 in the second exemplary embodiment (FIG. 3). Therefore, operation of the semiconductor device 10b according to the present exemplary embodiment is completely the same as the semiconductor device 10a according to the second exemplary embodiment, and the voltage $V_{F\_P}$ applied to the field plate electrode 106 is, with regard to the drain voltage $V_d$, the same as the divided voltage $V_5$ applied to the two ends of the diodes 115.

Mechanism and Effects of the Third Exemplary Embodiment

Operation of the semiconductor device 10b according to the present exemplary embodiment is completely the same as the semiconductor device 10a according to the second exemplary embodiment, so that it is possible to obtain effects similar to the second exemplary embodiment. A difference from the second exemplary embodiment is that, by connecting a plurality of diodes in series as a variable resistor, it is possible to increase the voltage $V_{F\_P}$ applied to the field plate electrode 106, and the effect of suppressing the drain current decrease is improved.

Figure 7:
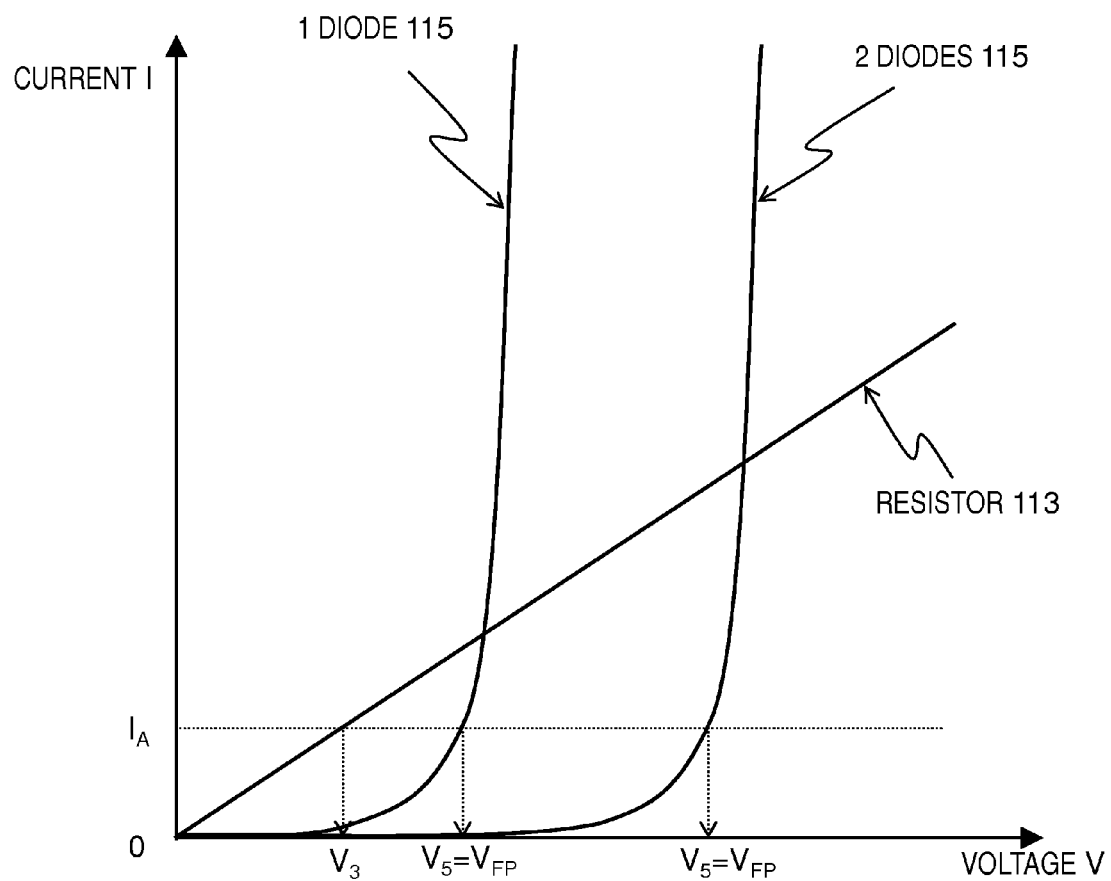
FIG. 7 is a descriptive diagram schematically showing the relationship between flowing current and voltage applied to the two ends of each of the resistor 113 and diodes 115, with respect to FIG. 6.

A reason for this is described using FIG. 7. FIG. 7 is a descriptive diagram schematically showing a relationship between flowing current and voltage applied to the two ends of each of a resistor 113 and the diodes 115. FIG. 7 shows, with regard to a case of using only one diode for the diodes 115 and a case of using two diodes connected in series, what the voltage $V_{F\_P}$ applied to the field plate electrode 106 is like. As is understood therefrom, if two diodes are connected in series, compared to using one, since the so-called turn-on voltage is high, a divided voltage $V_5$ applied to the diodes 115 when viewed with the same current ($I_A$) is large. Since the voltage $V_{F\_P}$ applied to the field plate electrode 106 is the same as the divided voltage $V_5$ applied to the two ends of the diodes 115, the divided voltage $V_5$ being large means that the voltage $V_{F\_P}$ applied to the field plate electrode 106 is large. If the voltage $V_{F\_P}$ applied to the field plate electrode 106 is large, an effect of reducing the surface depletion layer is increased, so that as a result, by having a plurality of diodes connected in series, the effect of suppressing the drain current decrease is further increased.

Fourth Exemplary Embodiment

Figure 8:
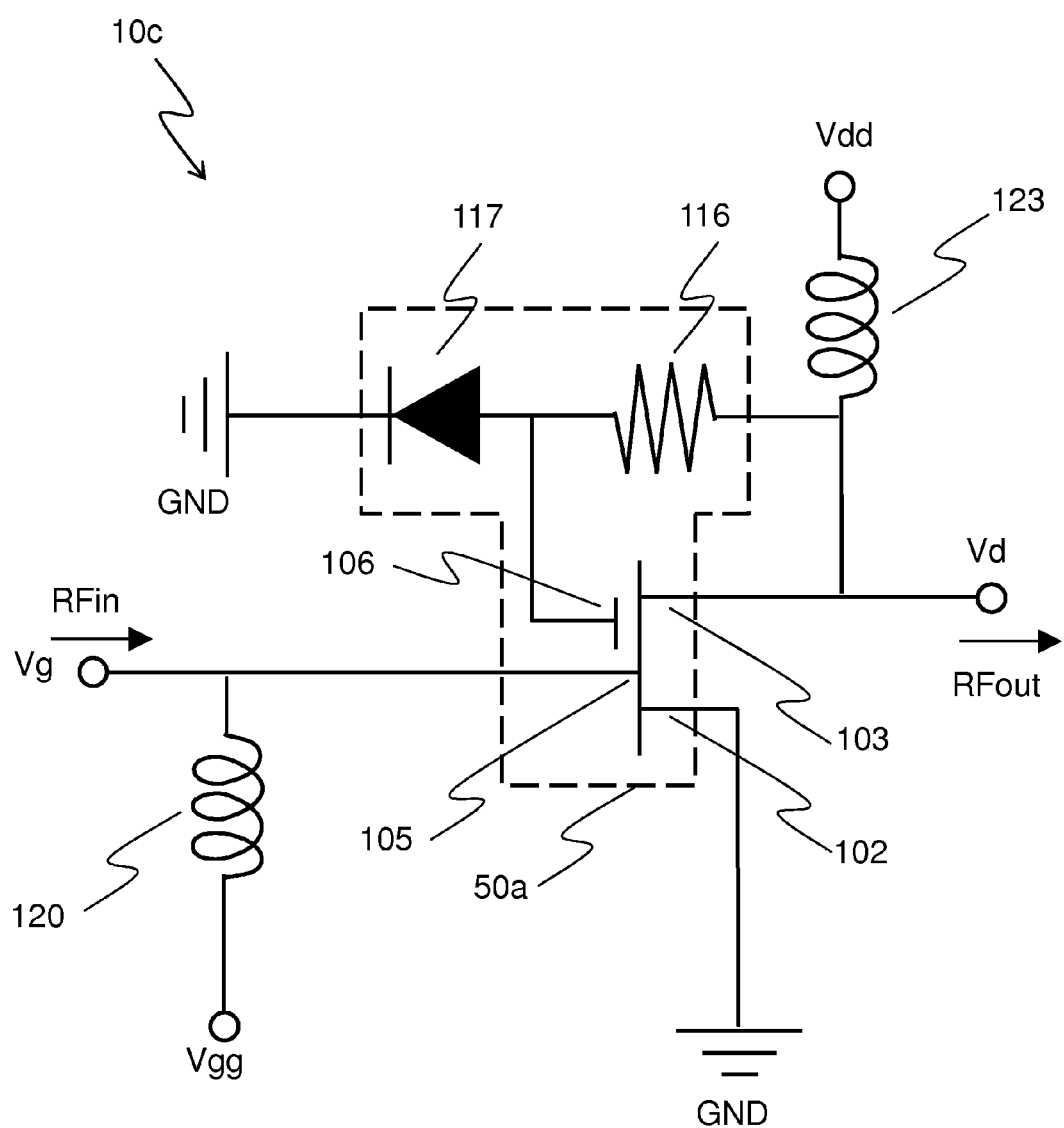
FIG. 8 is a circuit block diagram of a semiconductor device according to a fourth exemplary embodiment.

A fourth exemplary embodiment is an embodiment of the semiconductor device in which a field-effect transistor and a voltage dividing circuit are formed on the same semiconductor chip. FIG. 8 is a circuit block diagram of the semiconductor device according to the fourth exemplary embodiment, and FIG. 9 is a planar view schematically showing a structure of the semiconductor chip 50a of FIG. 8. It is to be noted that since the structure of a cross-section a-a of a field-effect transistor in FIG. 9 is the same as a cross-section structure of the field-effect transistor 50 of the first exemplary embodiment shown in FIG. 2, a cross-section view of the first exemplary embodiment shown in FIG. 2 is used in conjunction with this description.

The semiconductor device 10c according to the fourth exemplary embodiment, as shown in FIG. 8, has a configuration with regard to circuitry that is almost the same as the semiconductor device 10a of the second exemplary embodiment. Specifically, a variable resistor 114 in the second exemplary embodiment (refer to FIG. 3) is configured by a diode 117 in the fourth exemplary embodiment.

A characteristic of the configuration of the present exemplary embodiment is that the diode 117 and a resistor 116 determining a voltage $V_{F\_P}$ applied to a field plate electrode 106 are formed in the middle of the field-effect transistor chip 50a. With regard to the field-effect transistor chip 50a, as shown in FIG. 9, a field-effect transistor is formed by arranging, in an active region, each of a source electrode 102, a drain electrode 103, a gate electrode 105 and the field plate electrode 106, in a comb-like form.

At the top end of FIG. 9, a gate pad 140 connected to the gate electrode 105, and a grounding electrode (pad) 130 connected to a cathode electrode 1172 of the diode 117 are provided. Furthermore, at the lower side of a drawing outside of the region illustrated in FIG. 9, a source pad connected to the source electrode 102 and a drain pad connected to the drain electrode 103 are provided.

The resistor 116 and the diode 117 are formed in an inactive region of the field-effect transistor chip 50a. The resistor 116 includes a resistance region 1161 and two ohmic electrodes 1162 and 1163 formed in the middle of the resistance region 1161, and the diode 117 includes a semiconductor active region 1171 and a cathode electrode 1172 and an anode electrode 1173 formed in the semiconductor active region 1171. By the ohmic electrode 1162 being connected to the drain electrode 103, the ohmic electrode 1163 being connected to the anode electrode 1173 and the field plate electrode 106, and the cathode electrode 1172 being connected to the grounding electrode (pad) 130, a circuit configuration within the field-effect transistor chip 50a shown in FIG. 8 is realized.

A field-effect transistor of the same structure as the hetero-junction field-effect transistor using a nitride semiconductor in the first exemplary embodiment shown in FIG. 2 is formed in a cross-sectional structure of section a-a in which the field-effect transistor is configured within the field-effect transistor chip 50a. Here, for the resistance region 1161 configuring the resistor 116, as a rule a material that is used as a resistor in semiconductor devices can be widely used, such as a metal, a metal oxide, a metal nitride, a semiconductor resistive layer or the like. It is to be noted that at least some semiconductor layers of an epi substrate 100 (refer to FIG. 2) are formed in common in the inactive region and the active region in FIG. 9.

A description is given concerning a layout arrangement of the field-effect transistor of FIG. 9. It is to be noted that in the description of the layout arrangement, unless otherwise noted, the source electrode 102, the drain electrode 103 and the gate electrode 105 indicate parts directly connected to a semiconductor layer (electron supply layer 1004).

In FIG. 9, in order that the distance between the source electrode 102 and the drain electrode 103 is even, the source electrode 102 and the drain electrode 103 are arranged in parallel facing one another. Furthermore, in order that the distance between the gate electrode 105 and the source electrode 102 is even with regard to each part thereof, the gate electrode 105 is arranged in parallel to the source electrode 102 and the drain electrode 103, between the source electrode 102 and the drain electrode 103. Thus, the distance between the gate electrode 105 and the drain electrode 103 is even with regard to each part thereof. It is to be noted that in FIG. 9, the arrangement is such that the distance between the gate electrode 105 and the source electrode 102 is shorter than the distance between the gate electrode 105 and the drain electrode 103.

The field plate electrode 106 overlaps the gate electrode 105, and is arranged in parallel with the gate electrode 105, towards the drain electrode 103 from the gate electrode 105. Therefore, the width with which the gate electrode 105 and the field plate electrode 106 are arranged to overlap is equal at all positions. Similarly, the width with which the field plate electrode 106 is arranged to jut out to the drain electrode side 103 from the gate electrode 105 is equal at all positions.

The field plate electrode 106 is preferably configured by a material of sufficiently low resistance such as a metal or the like, and since a current does not flow to the field plate electrode 106 as direct current, the potential of each position of the field plate electrode 106 is the same potential.

The semiconductor device 10c according to the fourth exemplary embodiment, similar to the semiconductor device according to the first to third exemplary embodiments, functions as an RF power amplifier. In the fourth exemplary embodiment, since the configuration is similar to the semiconductor device of the second exemplary embodiment with regard to circuitry, operation thereof is completely the same as the semiconductor device of the second exemplary embodiment.

Since operation of the semiconductor device 10c according to the fourth exemplary embodiment is almost the same as the semiconductor device of the second exemplary embodiment, effects similar to the semiconductor device of the second exemplary embodiment can be obtained. In addition, in the present exemplary embodiment, by forming the resistor 116 and the diode 117 within the semiconductor chip 50a, the semiconductor device can be made small and manufacturing cost can be reduced.

The field plate electrode 106 is arranged towards the drain electrode 103 from the gate electrode 105, and in the vicinity of the gate electrode the distance from the gate electrode is the same at all positions thereof. Since a DC current does not flow in the field plate electrode 106 and material of low resistance is used, the potential is equal at each position of the field plate electrode 106. Therefore since relative layouts with respect to the gate electrode and the drain electrode of the field plate electrode 106 are the same and the potentials are also the same, it is possible to evenly suppress, in all regions, the drain current decrease due to a transient response phenomenon in each region that is a transistor channel by the field plate electrode 106.

It is to be noted that in the respective exemplary embodiments described above, descriptions have been given concerning a field-effect transistor in which the gate is Schottky-connected to the semiconductor layer, but the field-effect transistor is effective also in a case where the drain current decrease occurs due to a transient response phenomenon for an MIS field-effect transistor with an insulating film provided between the semiconductor layer and gate electrode.

In the respective exemplary embodiments described above, a description was given concerning examples in which the source electrode of the field-effect transistor is grounded directly to a reference potential (GND), but the source electrode may be grounded via a resistance to the reference potential (GND).

It is to be noted that the respective disclosures of the abovementioned patent literature are hereby incorporated by reference into this specification. Modifications and adjustments of exemplary embodiments and examples are possible within the bounds of the entire disclosure (including the scope of the claims and the drawings) of the present invention, and also based on fundamental technological concepts thereof. Furthermore, multiple combinations and selections of various disclosed elements (including respective elements of the respective claims, respective elements of the respective exemplary embodiments, and respective elements of the respective drawings) are possible within the scope of the claims of the present invention. That is, the present invention clearly includes every type of transformation and modification that a person skilled in the art can realize according to the entire disclosure including the scope of the claims and drawings, and to technological concepts thereof.

REFERENCE SIGNS LIST 10, 10a, 10b, 10c: semiconductor device
50: field-effect transistor
100: epi substrate
101: 2 DEG (2 Dimensional Electron Gas) channel
102: source electrode
103: drain electrode
104: protective film (insulating film)
105: gate electrode
106: field plate electrode (FP electrode)
110, 110a, 110b: voltage dividing circuit
111, 113, 116: (first) resistor
112: (second) resistor (constant resistance)
114: (second) resistor (non-linear resistance element)
115: (second) resistor (diodes connected in series)
115a, 115b: diode
117: (second) resistor (diode)
120, 121, 122, 123: choke inductor
130: grounding electrode (pad)
140: gate pad
1001: substrate
1002: buffer layer
1003: (GaN) channel layer
1004: (AlGaN) electron supply layer
$V_{g\_g}$: gate bias power supply
$V_{d\_d}$: drain bias power supply

The invention claimed is:

1. A semiconductor device, comprising:
a field-effect transistor that has a source electrode and a drain electrode connected to a semiconductor layer, a gate electrode provided on a surface of the semiconductor layer between the source electrode and the drain electrode, and a field plate electrode provided on the surface of the semiconductor layer in a vicinity of the gate electrode via an insulating layer, wherein the field-effect transistor amplifies radio frequency (RF) signals transmitted in an RF signal path including the gate electrode and the drain electrode, the RF signals are received by the gate electrode and outputted from the drain electrode; and a voltage dividing circuit that divides potential difference between the drain electrode and a reference potential, and applies a bias voltage such that respective parts of the field plate electrode have a mutually equal potential, wherein a choke inductor is disposed between a bias power supply of the drain electrode and the RF signal path such that the bias power supply is isolated from the RF signal path by the choke inductor.

2. The semiconductor device according to claim 1, being configured such that channel narrowing, caused by carriers being injected to the surface of the semiconductor in the vicinity of the gate electrode, is suppressed by a bias voltage applied to the field plate electrode.

3. The semiconductor device according to claim 1, wherein the source electrode is connected to the surface of the semiconductor layer opposing the drain electrode, with a predetermined distance from the drain electrode that is connected to the surface of the semiconductor layer, the gate electrode is arranged on the surface of the semiconductor layer between the drain electrode and the source electrode, with a predetermined distance, respectively from the drain electrode and the source electrode, and the field plate electrode is arranged so as to partially overlap a portion of the gate electrode nearest the drain electrode in plane view, wherein an insulating film is disposed between the gate electrode and the field plate electrode such that a distance between a surface of the gate electrode and a surface of the field plate electrode is constant.

4. The semiconductor device according to claim 1, wherein a source of the field-effect transistor is connected to the reference potential.

5. The semiconductor device according to claim 1, wherein a source of the field-effect transistor is connected to the reference potential via a resistance.

6. The semiconductor device according to claim 1, wherein the voltage dividing circuit comprises a first resistor connected between the drain and the field plate electrode, and a second resistor connected between the field plate electrode and the reference potential, the second resistor includes a non-linear resistance element, and a positive voltage is applied as a DC voltage with respect to the reference potential by the voltage dividing circuit, to the field plate electrode.

7. The semiconductor device according to claim 1, wherein the voltage dividing circuit comprises a first resistor connected between the drain electrode and the field plate electrode, and a second resistor connected between the field plate electrode and the reference potential, and the second resistor includes a semiconductor element having a constant voltage characteristic.

8. The semiconductor device according to claim 6, wherein the second resistor includes a plurality of diode elements connected in series in a forward direction.

9. The semiconductor device according to claim 6, wherein a resistance value of the first resistor is 1 k n or more.

10. The semiconductor device according to claim 1, wherein total resistance value of the voltage dividing circuit is 1 k n or more.

11. The semiconductor device according to claim 1, wherein the field-effect transistor and the voltage dividing circuit are formed on an upper layer of the same semiconductor region.

12. The semiconductor device according to claim 1, wherein the gate electrode is Schottky-connected to a semiconductor layer, and channel narrowing caused by carrier injection to the semiconductor layer from the gate electrode is suppressed by a bias voltage applied to the field plate electrode.

13. The semiconductor device according to claim 1, wherein the gate electrode is arranged on a surface of the semiconductor layer via an insulating layer.

14. The semiconductor device according to claim 1, wherein the field-effect transistor is a hetero-junction field-effect transistor that uses a nitride semiconductor.

15. The semiconductor device according to claim 1, wherein the field plate electrode is arranged so as to partially overlap a portion of the gate electrode.

16. The semiconductor device according to claim 1, wherein the field plate electrode includes a first portion that overlaps the gate electrode in a cross-sectional view and a second portion that does not overlap the gate electrode in the cross-sectional view.

17. The semiconductor device according to claim 16, wherein the second portion of the field plate electrode is closer to the drain electrode than the first portion of the field plate electrode.

18. The semiconductor device according to claim 17, wherein distance between the second portion of the field plate electrode and the drain electrode is constant in a plane view of the semiconductor device.

* * * * *